(12) United States Patent
Shimatani et al.

(10) Patent No.: US 11,302,834 B2
(45) Date of Patent: Apr. 12, 2022

(54) ELECTROMAGNETIC WAVE DETECTOR

(71) Applicant: Mitsubishi Electric Corporation, Chiyoda-ku (JP)

(72) Inventors: Masaaki Shimatani, Chiyoda-ku (JP); Shimpei Ogawa, Chiyoda-ku (JP); Daisuke Fujisawa, Chiyoda-ku (JP); Satoshi Okuda, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 7 days.

(21) Appl. No.: 16/076,611

(22) PCT Filed: Feb. 24, 2016

(86) PCT No.: PCT/JP2016/055485
§ 371 (c)(1),
(2) Date: Aug. 8, 2018

(87) PCT Pub. No.: WO2017/145299
PCT Pub. Date: Aug. 31, 2017

(65) Prior Publication Data
US 2019/0051763 A1    Feb. 14, 2019

(51) Int. Cl.
*H01L 31/028* (2006.01)
*H01L 27/144* (2006.01)
(Continued)

(52) U.S. Cl.
CPC ........ *H01L 31/028* (2013.01); *H01L 27/1443* (2013.01); *H01L 27/1446* (2013.01);
(Continued)

(58) Field of Classification Search
CPC ....... H01L 29/1606; H01L 2924/13088; H01L 31/028; H01L 31/0288
See application file for complete search history.

(56) References Cited

U.S. PATENT DOCUMENTS

2011/0042650 A1   2/2011  Avouris et al.
2011/0102068 A1*  5/2011  Bouchiat ............ G01N 27/4146
                                                              327/527
(Continued)

FOREIGN PATENT DOCUMENTS

JP    2013-502735 A    1/2013
JP    2013-537700 A   10/2013
(Continued)

OTHER PUBLICATIONS

N. Liu et al., "Large-Area, Transparent, and Flexible Infrared Photodetector Fabricated Using P-N Junctions Formed by N-Doping Chemical Vapor Deposition Grown Graphene," Nano Letters 2014, vol. 14, pp. 3702-3708. (Year: 2014).*
(Continued)

*Primary Examiner* — Shih Tsun A Chou
*Assistant Examiner* — Peter M Albrecht
(74) *Attorney, Agent, or Firm* — Xsensus LLP

(57) ABSTRACT

This electromagnetic wave detector that detects electromagnetic waves by performing photoelectric conversion includes: a substrate; an insulating layer that is provided on the substrate; a graphene layer that is provided on the insulating layer; a pair of electrodes, which are provided on the insulating layer, and which are connected to both ends of the graphene layer, respectively; and a contact layer that is provided such that the contact layer is in contact with the graphene layer. The contact layer is formed of a material having a polar group, and a charge is formed in the graphene layer by having the contact layer in contact with the graphene layer.

16 Claims, 12 Drawing Sheets

(51) Int. Cl.

| | |
|---|---|
| *H01L 31/0216* | (2014.01) |
| *H01L 31/0224* | (2006.01) |
| *H01L 31/0236* | (2006.01) |
| *H01L 31/103* | (2006.01) |
| *H01L 31/18* | (2006.01) |
| *H01L 31/0232* | (2014.01) |
| *H01L 31/0288* | (2006.01) |
| *H01L 31/101* | (2006.01) |
| *H01L 31/112* | (2006.01) |
| *H01L 31/0352* | (2006.01) |

(52) U.S. Cl.
CPC ...... *H01L 31/0232* (2013.01); *H01L 31/0288* (2013.01); *H01L 31/02161* (2013.01); *H01L 31/02366* (2013.01); *H01L 31/022408* (2013.01); *H01L 31/035209* (2013.01); *H01L 31/101* (2013.01); *H01L 31/103* (2013.01); *H01L 31/112* (2013.01); *H01L 31/1804* (2013.01)

(56) References Cited

U.S. PATENT DOCUMENTS

| | | |
|---|---|---|
| 2013/0032782 A1 | 2/2013 | Gerasimos et al. |
| 2013/0048952 A1 | 2/2013 | Chen et al. |
| 2014/0158988 A1* | 6/2014 | Chen ............... H01L 29/1606 257/29 |
| 2015/0206940 A1 | 7/2015 | Choi et al. |

FOREIGN PATENT DOCUMENTS

| | | | |
|---|---|---|---|
| JP | 2014-522117 A | 8/2014 | |
| KR | 101351001 B1 * | 1/2014 | ......... H01L 29/1606 |
| WO | WO 2011/023603 A2 | 3/2011 | |

OTHER PUBLICATIONS

D. B. Farmer et al., "Behavior of a chemically doped graphene junction," Applied Physics Letters 94, 213106 (2009). (Year: 2009).*
H. Fang et al., "High-Performance Single Layered WSe2 p-FETs with Chemically Doped Contacts," Nano Letters 2012, vol. 12, pp. 3788-3792. Published Jun. 14, 2012. (Year: 2012).*
P. Wei et al., "Tuning the Dirac Point in CVD-Grown Graphene through Solution Processed n-Type Doping with 2-(2-Methoxyphenyl)-1,3-dimethyl-2,3-dihydro-1H-benzoimidazole," Nano Letters 2013, vol. 13, pp. 1890-1897. Published Mar. 28, 2013. (Year: 2013).*
K. Brenner et al., "Single step, complementary doping of graphene," Applied Physics Letters 96, 063104 (2010). (Year: 2010).*
M. S. Choi et al., "Lateral MoS2 p-n Junction Formed by Chemical Doping for Use in High-Performance Optoelectronics," ACS Nano, vol. 8, No. 9, 9332-9340 (2014). (Year: 2014).*
Y. Choi et al., "On-Demand Doping of Graphene by Stamping with a Chemically Functionalized Rubber Lens," ACS Nano 2015, 9(4), 4354-4361. (Year: 2015).*
H. Qiao et al., "Broadband Photodetectors Based on Graphene-Bi2Te3 Heterostructure," ACS Nano, vol. 9, No. 2, pp. 1886-1894 (2015). Published online Jan. 17, 2015. (Year: 2015).*
D. B. Velusamy et al., "Flexible transition metal dichalcogenide nanosheets for band-selective photodetection," Nature Communications, vol. 6, article No. 8063 (2015). Published Sep. 2, 2015. (Year: 2015).*
H. Tan et al., "Doping Graphene Transistors Using Vertical Stacked Monolayer WS2 Heterostructures Grown by Chemical Vapor Deposition," ACS Applied Materials & Interfaces, vol. 8, pp. 1644-1652 (2016). Published Jan. 12, 2016. (Year: 2016).*
S. J. Kim et al., "Tunable functionalization of graphene nanosheets for graphene-organic hybrid photodetectors," Nanotechnology, vol. 27, article No. 075709 (2016). Published Jan. 20, 2016. (Year: 2016).*
International Search Report dated May 17, 2016 in PCT/JP2016/055485 filed Feb. 24, 2016.
Wang, S. et al., "Photocurrent generation of a single-gate graphene p-n junction fabricated by interfacial modification", Nanotechnology, XP020289300, vol. 26, No. 38, Sep. 3, 2015, 6 pages.
Baltazar, J. et al., "Facile Formation of Graphene P-N Junctions Using Self-Assembled Monolayers", The Journal of Physical Chemistry, XP055140698, vol. 116, No. 36, Sep. 13, 2012, pp. 19095-19103.
Baltazar, J. et al., "Photochemical Doping and Tuning of the Work Function and Dirac Point in Graphene Using Photoacid and Photobase Generators", Advanced Functional Materials, XP055560977, vol. 24, No. 32, Jun. 4, 2014, pp. 5147-5156.
Peimyoo, N. et al., "Photocontrolled Molecular Structural Transition and Doping in Graphene", ACS Nano, XP055562019, vol. 6, No. 10, Sep. 10, 2012, pp. 8878-8886.
Echtermeyer, T. J. et al., "Surface plasmon polariton graphene photodetectors", Arxiv.org, Cornell University Library, XP080802964, May 25, 2015, 14 pages.
Li, J. et al., Photosensitive Graphene Transistors, Advanced Materials, XP055563719, vol. 26, No. 31, Apr. 8, 2014, pp. 5239-5273.
Sojoudi, H. et al., "Formation of Air Stable Graphene p-n-p Junctions Using an Amine-Containing Polymer Coating", Advanced Materials Interfaces, XP055559801, 1400378, vol. 1, No. 9, Nov. 10, 2014, 7 pages.
Kiriya, D. et al., "Air-Stable Surface Charge Transfer Doping of MoS2 by Benzyl Viologen", Journal of the American Chemical Society, XP055610668, vol. 136, No. 22, May 16, 2014, pp. 7853-7856.
Li, Y. et al., "Carrier Control of MoS2 Nanoflakes by Functional Self-Assembled Monolayers", ACS Nano, XP055610506, vol. 7, No. 9, Aug. 21, 2013, pp. 7795-7804.
Jing, Y. et al., "Small molecules make big differences: molecular doping effects on electronic and optical properties of phosphorene", Nanotechnology, XP020280683, vol. 26, No. 9, Feb. 10, 2015, 9 pages.
Extended European Search Report dated Aug. 13, 2019, in Patent Application No. 16891456.2, 23 pages.
Chinese Office Action dated Jan. 6, 2021, in corresponding Chinese Patent Application No. 201680081193.5.
Chinese Office Action dated May 6, 2021 in Chinese Application No. 201680081193.5.

* cited by examiner

ELECTROMAGNETIC WAVE DETECTOR

TECHNICAL FIELD

The present invention relates to an electromagnetic wave detector, and more particularly to an electromagnetic wave detector using graphene for a photodetecting layer.

BACKGROUND ART

In conventional electromagnetic wave detectors, a semiconductor material is generally used for the detecting layer, but since the semiconductor material has a predetermined band gap, only electromagnetic waves having energy larger than the band gap can be detected.

On the other hand, an electromagnetic wave detector using graphene having a band gap of zero or very small value for a detecting layer is proposed (see, for example, Patent Document 1).

In addition, a structure is proposed in which a graphene layer and a metal oxide having a work function larger than that of the graphene layer are stacked on a SiC substrate to provide a pn junction region in the graphene layer, thereby increasing the photocurrent (see, for example, Patent Document 2).

PRIOR ART DOCUMENTS

Patent Documents

Patent Document 1: JP 2013-502735 A
Patent Document 2: JP 2013-537700 A

SUMMARY OF THE INVENTION

Problems to be Solved by the Invention

However, in the case of the invention described in Patent Document 1, when the detecting layer is a simple substance of graphene, a detectable wavelength range widens, but an absorption rate of the electromagnetic wave is as very low as several percent and detection sensitivity is low.

In addition, in the case of the invention described in Patent Document 2, forming a metal oxide having a work function larger than that of the graphene layer on the graphene layer allows the graphene layer to be doped with holes, but does not allow the graphene layer to be doped with electrons. In particular, since the graphene layer produced by chemical vapor deposition (CVD) method is usually doped p-type, a pn junction cannot be formed in practice.

In addition, when a graphene layer formed on a SiC substrate is used, since a voltage cannot be applied from the back gate, it is necessary to form a top gate on the graphene layer to apply a gate voltage. However, since forming the top gate reduces an opening area of the graphene layer with respect to incident electromagnetic waves, electromagnetic wave detection sensitivity is lowered.

In addition, since the graphene layer formed on the SiC substrate cannot be transferred, the electrode needs to be formed on the graphene, and during the electrode formation process, the graphene layer suffers process damage and mobility decreases.

Furthermore, in the process of forming metal oxide on the graphene layer, a mask has to be formed on the graphene layer, the mobility of graphene decreases due to suffering process damage, and device performance also deteriorates.

Thus, an object of the present invention is to provide an electromagnetic wave detector in which a contact layer made of a material having a polar group is brought into contact with the graphene layer to form electric charge in the graphene layer and an electron concentration gradient is provided in the graphene layer, thereby increasing a photocurrent and detecting electromagnetic waves with high sensitivity.

Means for Solving the Problems

The present invention is an electromagnetic wave detector configured to detect electromagnetic waves by photoelectric conversion, the electromagnetic wave detector including: a substrate; an insulating layer provided on the substrate; a graphene layer provided on the insulating layer; a pair of electrodes provided on the insulating layer, each of the pair of electrodes being connected to the graphene layer; and a contact layer provided so as to come into contact with the graphene layer. The contact layer is made of a material having a polar group, and electric charge is formed in the graphene layer due to contact between the contact layer and the graphene layer.

Effects of the Invention

In the present invention, by providing a contact layer having a polar group on the graphene layer and forming a contact region in contact with the contact layer and a non-contact region not in contact with the contact layer in the graphene layer, an electron density gradient is formed in the contact region and the non-contact region. Therefore, when electromagnetic waves are incident, photoelectric conversion occurs in the region where the electron density gradient is formed, the photocurrent increases, and detection sensitivity increases.

EMBODIMENTS OF THE INVENTION

Figure 1:
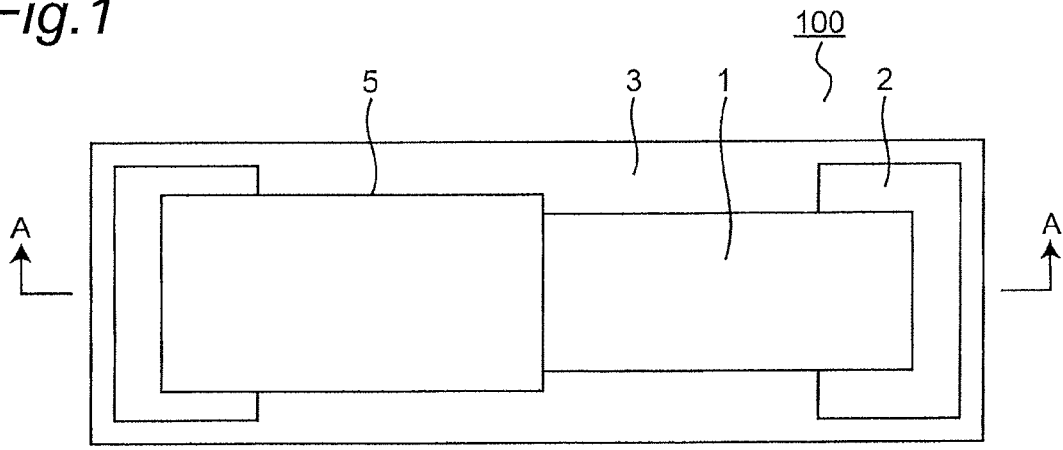
FIG. 1 is a top view of an electromagnetic wave detector according to a first embodiment of the present invention.

In embodiments of the present invention, the electromagnetic wave detector will be described using visible light or infrared light, but in addition to these, the present invention is also effective as a detector in a radio wave region such as ultraviolet light, near infrared light, a terahertz (THz) wave, or a microwave. In the embodiments of the present invention, these beams of light and radio waves are also collectively referred to as electromagnetic waves.

In the embodiments of the present invention, the electromagnetic wave detector is described by using a structure including two electrodes of a source and a drain and a back gate electrode, but the present invention can also be applied to electromagnetic wave detectors including other electrode structures such as a four-terminal electrode structure and a top gate structure.

The materials of the contact layer will be described by using terms such as n-type and p-type, and for example, n-type materials indicate materials having an electron donating group and p-type materials indicate materials having an electron withdrawing group. In addition to the presence or absence of a polar group, a material in which a bias in the electric charge is observed in the whole molecule and electrons are dominant is referred to as an n-type material, and a material in which a bias in the electric charge is observed in the whole molecule and holes are dominant is referred to as a p-type material. These include not only organic substances but also inorganic substances.

In addition, the surface plasmon resonance phenomenon or the plasmon resonance phenomenon being an interaction between metal surface and light, the phenomenon called pseudo surface plasmon resonance in the sense of resonance applied to metal surfaces other than the visible light region and the near infrared light region, and the phenomenon called metamaterial or plasmonic metamaterial in the sense of manipulating a specific wavelength with a structure of dimensions less than the wavelength are not particularly distinguished by name, and from the aspect of the effect of the phenomenon, these phenomena are treated as equivalent. Here, these resonances are referred to as surface plasmon resonance, plasmon resonance, or simply resonance.

In the following embodiments, the same reference numeral denotes the same or similar configuration, and a detailed description of overlapping portions will be omitted.

First Embodiment

Figure 2:
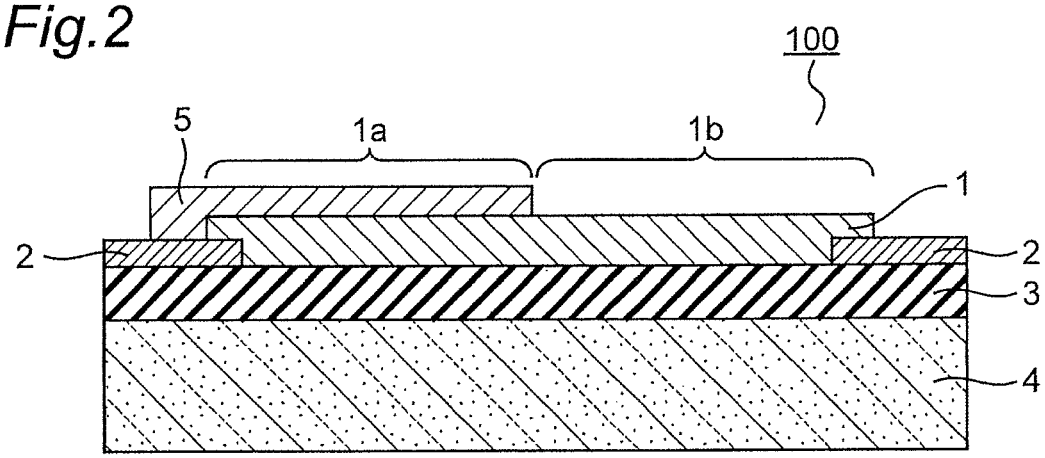
FIG. 2 is a cross-sectional view of the electromagnetic wave detector of FIG. 1 when viewed in an A-A direction.

FIG. 1 is a top view of an electromagnetic wave detector, the whole of which is represented by 10C, according to a first embodiment of the present invention, and FIG. 2 is a cross-sectional view of FIG. 1 when viewed in the A-A direction.

The electromagnetic wave detector 100 according to the first embodiment of the present invention is an electromagnetic wave detector 100 configured to detect electromagnetic waves by photoelectric conversion, the electromagnetic wave detector 100 including: a substrate 4; an insulating layer 3 provided on the substrate 4; a graphene layer 1 provided on the insulating layer 3; a pair of electrodes 2 provided on the insulating layer 3, each of the pair of electrodes 2 being connected to the graphene layer 1; and a contact layer 5 provided so as to come into contact with the graphene layer 1. The contact layer 5 is made of a material having a polar group, and electric charge is formed in the graphene layer 1 due to contact between the contact layer 5 and the graphene layer 1.

That is, the electromagnetic wave detector 100 includes a substrate 4 made of Si, for example. The substrate 4 holds the whole electromagnetic wave detector 100, and is made of, for example, a high resistivity silicon substrate or a substrate having enhanced insulating properties by forming a thermal oxide film. As described below, a silicon substrate doped so as to form a back gate may be used. In the case of a substrate having a thermal oxide film, the thermal oxide film may also serve as the insulating layer 3.

On the substrate 4, an insulating layer 3 made of, for example, silicon oxide ($SiO_2$), silicon nitride (SiN), aluminum oxide, nickel oxide, boron nitride (BN), or the like is provided. Since boron nitride is similar to graphene in atomic arrangement, boron nitride does net interfere with charge transfer in graphene during contact with graphene and does not inhibit the performance of graphene such as electron mobility. Thus, boron nitride is preferable as a base film of the graphene layer.

On the insulating layer 3, a pair of electrodes 2 are provided. The pair of electrodes 2 are provided so as to be connected to the respective ends of the graphene layer 1 formed on the electrodes 2. The electrode 2 is formed of a metal such as Au, Ag, Cu, Al, Ni, Cr, or Pd. An adhesion film (not shown) made of Cr or Ti may be formed between the electrode 2 and the underlying insulating layer 3. The shape of the electrode 2 is not particularly limited as long as the electrode 2 has a size and a thickness capable of outputting an electric signal.

On the insulating layer 3, a graphene layer 1 is provided. The graphene layer 1 is made of a single layer or two or more layers of graphene. Increasing the number of stacked graphene layers increases the light absorption rate and increases the sensitivity of the electromagnetic wave detector 100. Graphene is a monoatomic layer of two-dimensional carbon crystal, and the thickness of monolayer graphene is as very small as 0.34 nm for one carbon atom. Graphene has carbon atoms in each chain arranged in a hexagonal shape.

When the graphene layer 1 is made of a stacked structure of two or more layers of graphene, in any two layers of graphene included in the stacked structure, the directions of the lattice vectors of the hexagonal lattice do not need to match, that is, there may be a deviation in direction. In addition, a stacked structure in which the directions of the lattice vectors perfectly match may be used. In particular, when two or more layers of graphene are stacked, a band gap is formed, so that wavelength selection effect can be provided.

In addition, when nanoribbon-shaped graphene is used, a structure of a simple substance of graphene nanoribbon or a structure in which a plurality of graphene nanoribbons are arranged may be used. The graphene layer 1 may be non-doped, but may be doped p-type or n-type.

A contact layer 5 is provided on the graphene layer 1. The contact layer 5 is made of a material containing a polar group. The polar group is classified into an electron withdrawing group and an electron donating group, the electron withdrawing group has an effect of attenuating electron density, and the electron donating group, on the other hand, has an effect of increasing electron density. Examples of the electron withdrawing group include halogen, nitrile, a carboxyl group, a carbonyl group, and the like, and examples of the electron donating group include an alkyl group, alcohol, an amino group, a hydroxyl group, and the like. In addition to these materials, a polymer material in which electric charge is biased in the whole molecule due to the polar group to have polarity, or the like can also be applied to the contact layer 5. In organic substances, metals, semiconductors, insulators, two-dimensional materials, or mixtures of any of these, materials in which electric charge is biased in the molecule to have polarity can also be applied to the contact layer 5. In an embodiment, the contact layer 5 is a material to be selected from a group consisting of: a polymer material having polarity, a material having a hydroxyl group or a carboxyl group, a material in which oxidation-reduction reaction occurs by electromagnetic wave irradiation, a composition material comprising a photosensitizer having a quinone diazide group and a novolak resin, and an inorganic material having polarity.

For example, when the contact layer 5 has an OH group, an electron donating property is generated by the resonance effect of the OH group, and the n-type doping is available. In addition, when the contact layer 5 has a carboxyl group, the electron withdrawing property is generated by the carboxyl group, and the p-type doping is available. Supplying carriers generated by this oxidation-reduction reaction to graphene accelerates doping.

Thus, the contact layer 5 is provided on the graphene layer 1, and the graphene layer 1 and the contact layer 5 come into contact with each other, whereby the graphene layer 1 includes a contact region 1a in which electric charge is formed and a non-contact region 1b in which electric charge is not formed.

In general, it is known that when graphene is doped by an inorganic substance and graphene being brought into contact with each other, graphene is doped p-type when the work function of the inorganic substance is larger than the work function of graphene, and graphene is doped n-type when the work function of the inorganic substance is smaller than the work function of graphene. On the other hand, since an organic substance does not have a definite work function, whether the graphene layer becomes n-type doped or p-type doped when an organic substance and graphene are brought into contact with each other needs to be determined from the polar group because this depends on the polarity of the molecules of the material used for the contact layer 5.

Using a composition containing a photosensitizer having a quinone diazide group generally called a positive photoresist and a novolac resin for the contact layer 5 allows a pattern of the contact layer 5 to be formed by photolithography or the like. Conventionally, in order to form a region not in contact with the contact layer 5, it has been necessary to mask the graphene layer 1 with a protective layer of a nonpolar layer. However, since the contact layer 5 can be formed only with photolithography when the photoresist is used, it is possible to reduce process damage and simplify the process.

Here, the film thickness of the contact layer 5 is preferably as thin as possible within a range in which doping for enabling photoelectric conversion can be performed when electromagnetic waves are radiated on the graphene layer 1. In addition, although the expression "layer" is used for the contact layer 5, the contact layer 5 may be a monomolecular film or the like and does not need to be a strict layer as long as the graphene layer 1 can be doped. Then, the contact layer 5 does not need to be solid and may be in a liquid or gaseous state as long as doping is possible.

In addition, as shown in FIG. 2, the contact layer 5 is preferably formed so as to cover the boundary between the graphene layer 1 and the electrode 2. An electron density gradient is generated at a boundary portion where the graphene layer 1 and the electrode 2 are in contact with each other, and becomes a resistance when a current is extracted from the electrode 2. However, when the contact layer 5 is formed so as to cover the boundary between the electrode 2 and the graphene layer 1, since an electron density gradient due to the contact layer 5 is added in addition to the electron density gradient generated between the electrode 2 and the graphene layer 1, the electron density gradient is formed stepwise, and the current extraction efficiency improves.

Naturally, it is also possible to adopt a structure in which the contact layer 5 does not cover the boundary between the graphene layer 1 and the electrode 2.

An output amplifier circuit (not shown) using graphene may be provided in an adjacent portion or a lower layer portion of the electromagnetic wave detector 100 together with the electromagnetic wave detector 100. Thus, operation is faster than that of the output amplifier circuit formed of the silicon-based semiconductor material, and a high-performance electromagnetic wave detector can be achieved.

In addition, using graphene as a material of a peripheral circuit such as a reading circuit allows high speed reading and simplification of the manufacturing process.

In the operating state of the electromagnetic wave detector 100, a photocurrent generated by the incidence of electromagnetic waves to the graphene layer 1 may be detected. In that case, the electromagnetic wave detector 100 operates whether or not an external bias is applied between the electrodes 2 at both ends of the photocurrent generation path of the graphene layer 1. However, applying a bias increases the detection efficiency of the generated carrier.

To the graphene layer 1, an electric circuit for extracting a change in photocurrent such as an external bias is connected via the electrode 2. For example, when a voltage $V_d$ is applied between the two electrodes 2 as a method for reading an electric signal, the amount of current $I_d$ flowing between the electrodes 2 changes according to the electric signal indicating a change in the resistance value in the graphene layer 1. Detecting the change in the amount of a current allows the magnitude of the incident electromagnetic wave to be detected. A circuit for passing a constant current may be added between the two electrodes 2 to detect the change amount of the voltage value.

Figure 3:
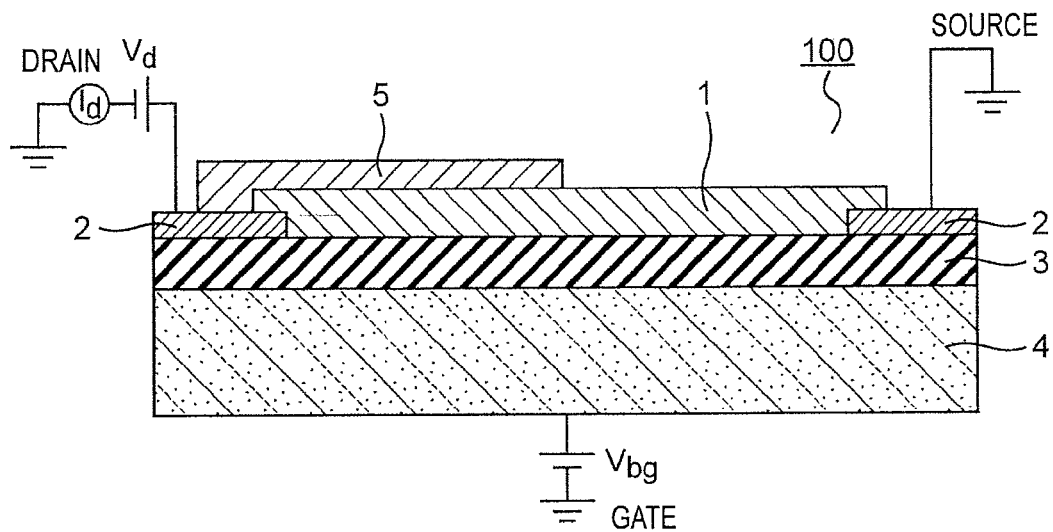
FIG. 3 is a cross-sectional view of the electromagnetic wave detector according to the first embodiment of the present invention.

In addition, as shown in FIG. 3, an electric signal may be extracted as a transistor structure with the back surface of the substrate 4 as a back gate terminal combined with the two-terminal electrodes 2. In this case, applying a voltage to the back surface of the substrate 4 allows a larger electric field to be generated in the graphene layer 1 and carriers generated by the incidence of electromagnetic waves to be detected with high efficiency.

In addition, only one of the pair of electrodes 2 may be formed, and by using this, the potential change of the graphene layer 1 due to the incidence of electromagnetic waves may be detected.

Figure 4:
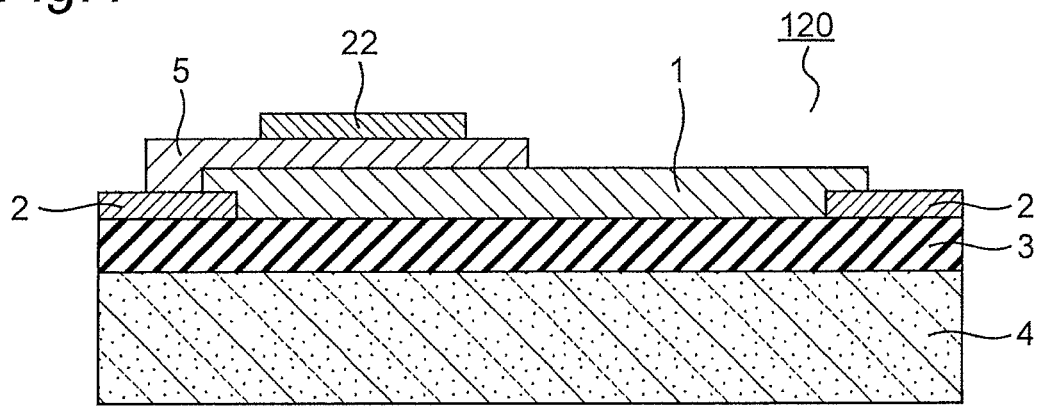
FIG. 4 is a cross-sectional view of another electromagnetic wave detector according to the first embodiment of the present invention.
Figure 5:
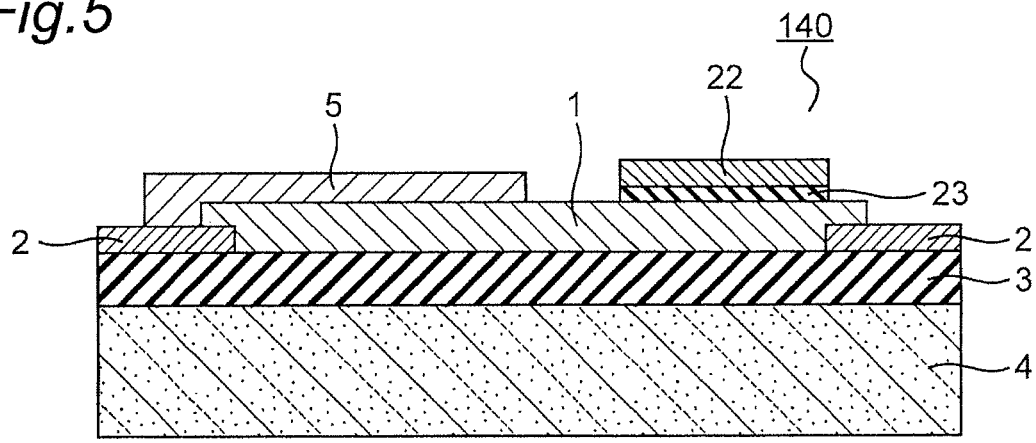
FIG. 5 is a cross-sectional view of another electromagnetic wave detector according to the first embodiment of the present invention.

In addition, as shown in FIGS. 4 and 5, a gate electrode 22 may be formed above the contact layer 5 or the graphene layer 1. When an insulator is used for the material of the contact layer 5, since the contact layer 5 can be used as a gate insulating layer, forming the gate electrode 22 directly on the contact layer 5 as shown in FIG. 4 allows the top gate to be easily formed.

On the other hand, when the contact layer 5 is not an insulator, in order to form a top gate, as shown in FIG. 5, it is necessary to form the gate electrode 22 on an insulation film 23 formed on the graphene layer 1. In addition, as described below, when a protective film is formed on the graphene layer 1, the gate electrode 22 may be formed on the protective film. Thus, when an array sensor is formed from a plurality of electromagnetic wave detectors, using the top gate structure allows the gate voltage for each pixel to be controlled.

Figure 6:
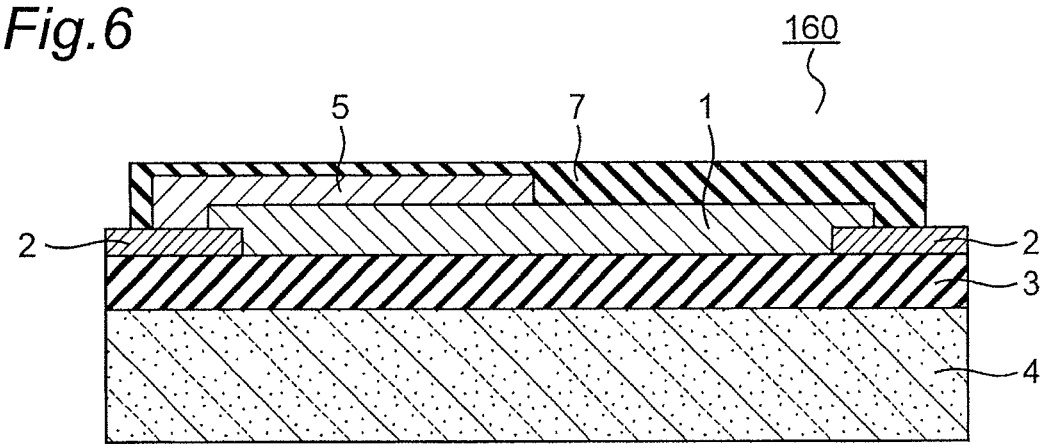
FIG. 6 is a cross-sectional view of another electromagnetic wave detector according to the first embodiment of the present invention.

In addition, as shown in FIG. 6, a protective film 7 may be formed so as to cover the graphene layer 1, the contact layer 5, and the electrodes 2. When the contact layer 5 is made of a thin film such as a native oxide or an organic substance, providing the protective film 7 can prevent the property of the contact layer 5 from changing due to the influence of the surrounding atmosphere. In particular, when an electromagnetic wave detector is used in a high-temperature and low-temperature environment, it is important to maintain contact between the graphene layer 1 and the contact layer 5. That is, providing the protective film 7 ensures stable operation. The protective film 7 is made of an insulating film such as silicon oxide ($SiO_2$), aluminum oxide ($Al_2O_3$), silicon nitride (SiN), or the like. In this case, it is desirable to select a material that transmits the electromagnetic waves to be detected, as the material of the protective film 7.

Figure 7:
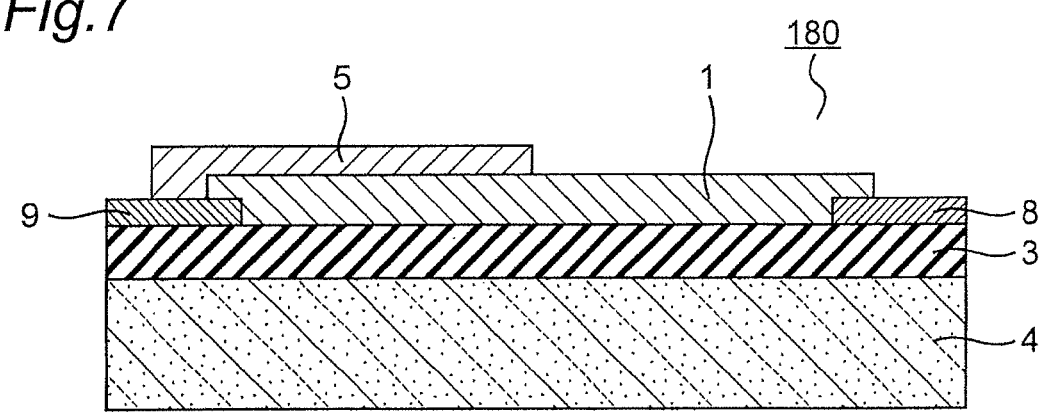
FIG. 7 is a cross-sectional view of another electromagnetic wave detector according to the first embodiment of the present invention.

In addition, as shown in FIG. 7, the pair of electrodes may be formed of different metals such as the electrode 8 (for example, source electrode) and the electrode 9 (for example, drain electrode). The Fermi level of graphene moves or the contact resistance of graphene is different depending on the kind of metals to be in contact. Therefore, when the electrodes 8 and 9 are made of different metals, the energy gaps are different between the source and the drain. As a result, a bias is generated between the electrodes 8 and 9 with carriers generated by the irradiation of light and the photocurrent is increased, so that the sensitivity can be improved.

In the first embodiment of the present invention, for the sake of simplicity, a case where a pair of electrodes 2 are formed and the electric resistance therebetween is detected is described as an example, but other structures such as transistor structures may be applied.

Next, an operation principle of the electromagnetic wave detector 100 according to the first embodiment of the present invention will be described. In the electromagnetic wave detector 100, the contact layer 5 is provided on the upper part of the graphene layer 1. Since the contact layer 5 is formed of a material having polarity as described above, charge transfer occurs in the graphene layer 1 according to the polarity of the material. Thus, the graphene layer 1 in contact with the contact layer 5 is doped in accordance with the polarity of the contact layer 5. Selectively using an electron donating group and an electron withdrawing group as a polar group allows the graphene layer 1 to be doped with n-type or p-type.

In addition, when the contact layer 5 contains a plurality of polar groups, the most influential polar group causes charge bias in the molecule. As long as charge bias occurs in the whole molecule, even if the molecule contains opposite polar groups, the molecule can be used as the contact layer 5.

Thus, in the electromagnetic wave detector 100 according to the first embodiment of the present invention, a contact region 1a in contact with the contact layer 5 and a non-contact region 1b not in contact with the contact layer 5 are formed in the graphene layer 1. In the graphene layer 1, the electron density is different between the contact region 1a and the non-contact region 1b depending on the doping from the contact layer 5. Thus, a gradient of electron density is generated inside the graphene layer 1. When a gradient of electron density occurs, optical carriers are generated by light irradiation similarly to a pn junction in a common semiconductor. As described above, in the electromagnetic wave detector 100 according to the first embodiment of the present invention, providing the contact layer 5 on the graphene layer 1 increases the photocurrent during light irradiation and improves the detection sensitivity.

It is not necessary that the electron density gradient formed in the graphene layer 1 is completely a pn junction, and if the electron density gradient is formed even a little, the detection sensitivity is improved.

In addition, using a material having a polar group for the contact layer 5 allows only a portion in contact with the contact layer 5 of the graphene layer 1 to be doped, without the graphene layer 1 separately doped, so that the manufacturing process is made easier.

In addition, if a material having an electron withdrawing group is used as the material of the contact layer 5, the graphene layer 1 can be doped with p-type, and if a material having an electron donating group is used, the graphene layer 1 can be doped with n-type.

In particular, if a material having an electron donating group is used, the graphene layer 1 can be doped n-type, so that the material having an electron donating group can also be applied to CVD graphene having p-type conductivity, and transferring CVD graphene onto the electrode allows process damage during electrode formation to be reduced.

In addition, using a doped Si substrate allows a back gate voltage to be applied, and the reduction in the channel opening due to the top gate formation is eliminated.

Using a photoresist having a polar group as the material of the contact layer 5 allows polarity conversion to be selectively caused by photolithography, electron beam (EB) exposure treatment, or the like. Therefore, it is unnecessary to form a layer for protecting the non-contact region at the time of forming the contact layer, and not only the opening area of the graphene layer increases, but also process damage can be reduced.

Next, a method for manufacturing the electromagnetic wave detector 100 will be briefly described. The method for manufacturing the electromagnetic wave detector 100 includes the following steps 1 to 5.

Step 1: A flat substrate 4 such as silicon is prepared.

Step 2: An insulating layer 3 is formed on the substrate 4. As for the insulating layer 3, for example, when the substrate 4 is silicon, the substrate 4 is thermally oxidized, and silicon oxide ($SiO_2$) may be formed. In addition, another insulating film may be formed by a CVD method or a sputtering method.

Step 3: An electrode 2 made of Au, Ag, Cu, Al, Ni, Cr, or the like is formed. At this time, an adhesion film (not shown) made of Cr or Ti may be formed between the insulating film 3 and the electrode 2 in order to improve the adhesion to the insulating layer 3 on the lower side. The electrode 2 is formed by, for example, forming a resist mask by using photolithography, EB lithography, or the like, and then depositing a metal layer thereon by vapor deposition, sputtering, or the like, and finally, removing the metal layer on the resist mask by lift-off.

Step 4: Graphene is formed on the electrode 2 and the insulating layer 3. The graphene may be formed by epitaxial growth or may be stuck by transferring a formed graphene layer by using a CVD method in advance. In addition, graphene peeled off by mechanical peeling or the like may be transferred. Subsequently, graphene is coated with a resist mask by photolithography or the like and etched with oxygen plasma to be patterned. Thus, graphene in an unnecessary portion other than the channel portion and the region in contact with the electrode 2 is removed, and the graphene layer 1 is formed.

Step 5: A photoresist layer is formed on the electrode 2 and the graphene layer 1. The photoresist layer is made of a composition containing, for example, a photosensitizer having a quinone diazide group and a novolak resin. Next, the photoresist layer is exposed and patterned by being immersed in an alkaline developer, whereby the contact layer 5 is formed by the photoresist layer being selectively left on the graphene layer 1. The graphene layer 1 underlying the contact layer 5 is doped p-type by the polar group of this photoresist, and a portion, of the graphene layer 1, where the contact layer 5 does not exist is doped n-type by exposure/development processing.

In the above steps 1 to 5, the electromagnetic wave detector 100 according to the first embodiment of the present invention is completed.

Figure 8:
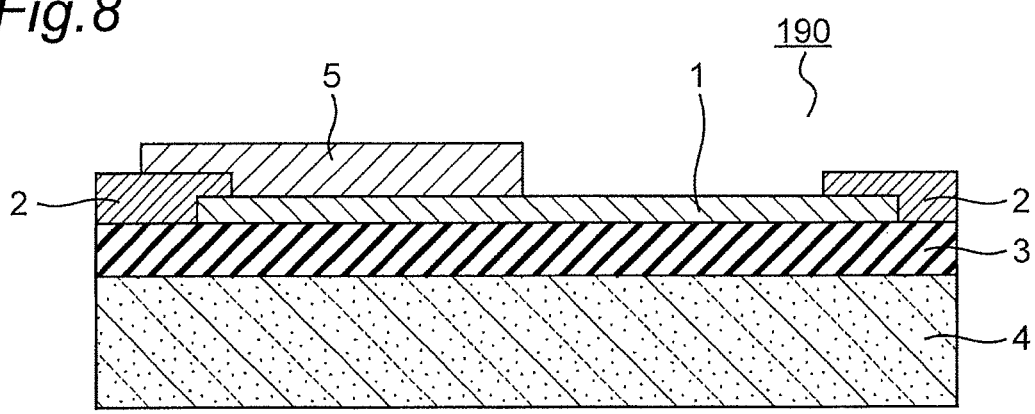
FIG. 8 is a cross-sectional view of another electromagnetic wave detector according to the first embodiment of the present invention.

In this case, the graphene layer 1 is formed on the electrode 2, but as shown in FIG. 8, a structure in which the graphene layer 1 is previously formed on the insulating film 3, and thereafter the electrode 2 is formed may be used.

In addition, by using a polymer having polarity instead of a photoresist as the material of the contact layer 5 allows the contact layer 5 to be formed on the graphene layer 1 by a coating method, and the contact layer 5 can be manufactured by a simple process.

Second Embodiment

In an electromagnetic wave detector according to a second embodiment, the contact layer 5 is made of a material that chemically performs polarity conversion or a material that performs polarity conversion with electromagnetic wave irradiation. The structure of the electromagnetic wave detector is the same as that of the electromagnetic wave detector 100 shown in FIG. 2, for example.

Polar conversion is a phenomenon in which polar groups are chemically converted, and refers to a phenomenon in which, for example, the electron withdrawing group is changed to an electron donating group, the electron donating group is changed to an electron withdrawing group, the polar group is changed to a nonpolar group, or the nonpolar group is changed to a polar group. When the contact layer 5 undergoes polarity conversion, electrons or holes generated during conversion are supplied to graphene. Thus, the graphene layer 1 in contact with the contact layer 5 is doped to become a contact region. In this case, even when the contact layer 5 is removed, the contact region of the graphene layer 1 in contact with the contact layer 5 remains in the doped state, so that it is also possible to form an electron density gradient without the contact layer 5. Thus, the area where the graphene layer 1 opens with respect to the incident light increases, and the detection sensitivity improves.

In addition, when the contact layer 5 is formed of a material producing polarity conversion by electromagnetic wave irradiation, polarity conversion can be selectively produced in the contact layer 5 by exposure processing or the like, and selectivity can be given to the doping region. Thus, doped regions (contact regions) of various patterns can be formed in the graphene layer 1 without forming a mask. In addition, using a material producing polarity conversion according to the wavelength of the electromagnetic wave to be detected allows polarity conversion to be produced only during light irradiation and the photocurrent to be increased by forming an electron density gradient. Accordingly, the detection sensitivity of the electromagnetic wave detector is improved.

Similarly to the case where oxidation-reduction reaction occurs in the contact layer 5 by electromagnetic wave irradiation and electrons or holes are generated during the oxidation-reduction reaction, the graphene layer 1 can be doped.

Figure 9:
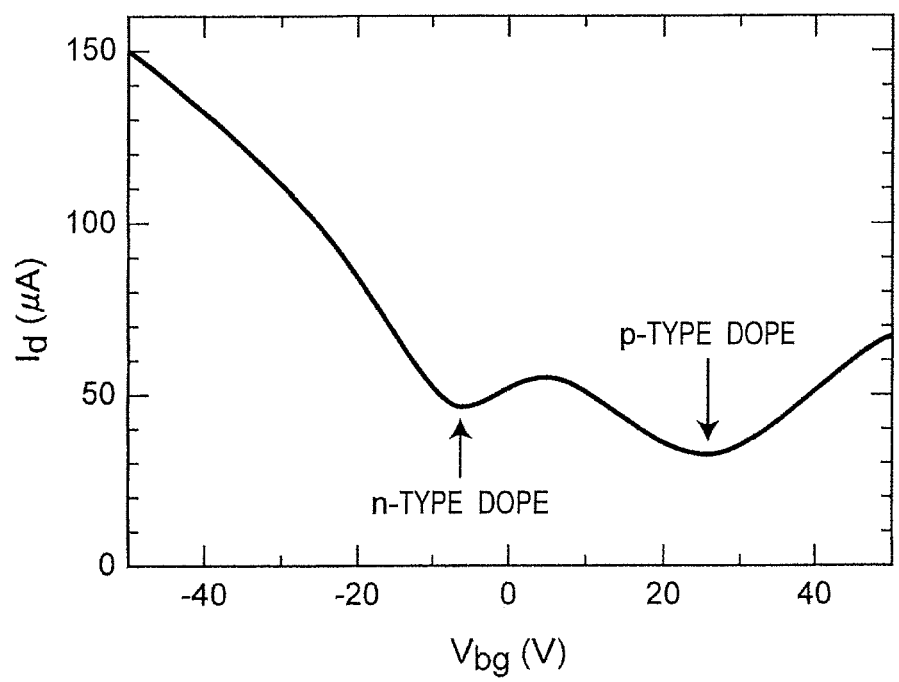
FIG. 9 shows electric characteristics of the electromagnetic wave detector according to the first embodiment of the present invention.

FIG. 9 shows the electrical characteristics of the electromagnetic wave detector according to the second embodiment of the present invention. In FIG. 9, the horizontal axis represents the back gate voltage and the vertical axis represents the current flowing between the two electrodes 2.

In the electromagnetic wave detector used for measurement, the graphene layer 1 is made of a single layer of graphene, the space between the two electrodes 2 is 50 µm, and the length of the electrode 2 (vertical direction in FIG. 1) is 50 µm. The electrode 2 is made of a multilayer structure of a metal whose outermost surface is made of gold and has a thickness of 30 nm. A Cr film having a thickness of 10 nm is formed between the electrode 2 and the insulating layer 3 in order to improve adhesion. The substrate 4 is made of p-type doped silicon. The substrate 4 operates as a back gate type in which a voltage is applied from the back surface. Here, one of the two electrodes 2 is set as a source, the other is set as a drain, and the substrate 4 is caused to operate as a back gate by applying a voltage from the back surface of the substrate 4. The insulating layer 3 is made of a silicon thermal oxide film ($SiO_2$) and has a thickness of 290 nm. The contact layer 5 is a positive photoresist (for example, OFPR-800LB manufactured by TOKYO OHKA KOGYO CO., LTD.) and is formed on the graphene layer 1 by exposure and development processing.

The above dimensions are the dimensions of the sample used for the measurement in FIG. 9, and the electromagnetic wave detector according to the embodiment of the present invention is not limited to these dimensions, and is appropriately designed according to the sensitivity or the like of the electromagnetic wave detector.

FIG. 9 shows a current flowing between two electrodes 2 when the back gate voltage is changed, and two kinds of Dirac points such as the Dirac point by n-type doping and the Dirac point by p-type doping appear. The graphene layer produced by the CVD method is usually doped p-type. However, applying a positive resist to the graphene layer 1 and performing exposure processing dopes the graphene layer 1 n-type in the process of polarity-converting the quinone diazide group being the photosensitizer in the resist into the carboxyl group. Furthermore, by immersing the graphene layer 1 in an alkaline developer containing tetramethylammonium hydroxide ($N(CH_3)_4OH$) having an OH group (for example, NMD-3 manufactured by TOKYO OHKA KOGYO Co., Ltd.), the OH group adheres on the surface of the graphene layer 1 and the n-type doping is accelerated. Therefore, the resist peeled portion is doped n-type. On the other hand, the resist residual portion remains in p-type in addition to p-type doping due to residual resist, combined with p-type doping inherent in CVD graphene. Thus, a pn junction is formed in the graphene layer 1, and characteristics having the n-type and p-type Dirac points shown in FIG. 9 are obtained.

Figure 10:
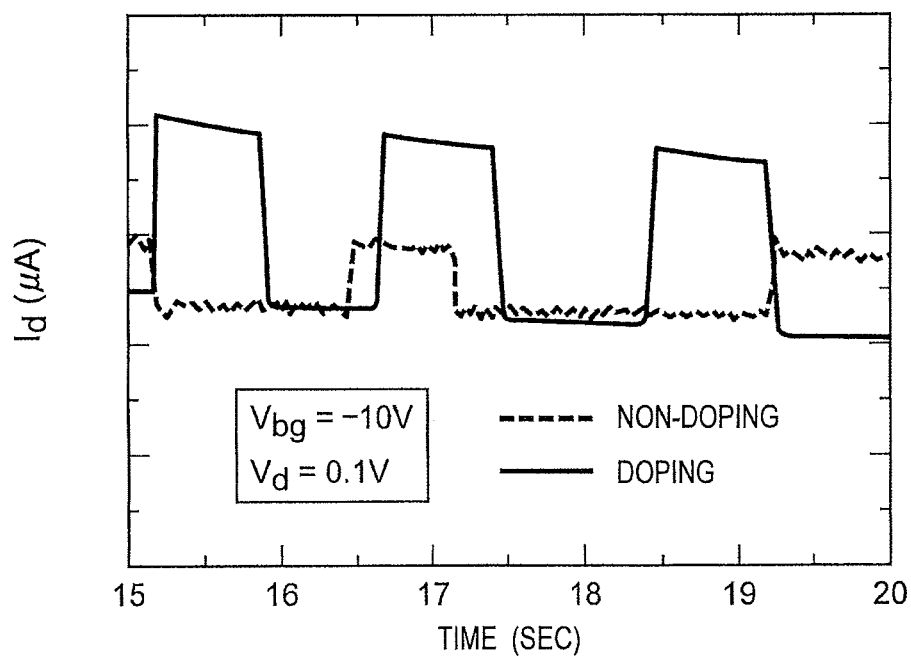
FIG. 10 shows photoresponse characteristics of the electromagnetic wave detector according to the first embodiment of the present invention.

FIG. 10 is a graph comparing photoresponse characteristics before and after the formation of the contact layer 5 on the electromagnetic wave detector according to the second embodiment of the present invention, and specifically, shows change in source-drain current when the white LED is radiated at a constant period, with the back gate voltage of the electromagnetic wave detector set at −10 V and the source-drain voltage at 0.1 V. In FIG. 10, the horizontal axis represents the irradiation time of the white LED and the vertical axis represents the source-drain current. In addition, the solid line shows the case where the contact layer 5 is formed and then a part of the graphene layer 1 is doped n-type, and the dotted line shows the case before the contact layer 5 is formed and the graphene layer 1 is not doped (the case where the whole graphene layer 1 is p-type).

As can be seen from FIG. 10, the current value when the graphene layer 1 is doped (after formation of the contact layer 5) is about 3 times as large as the current value when the graphene layer 1 is not doped (before formation of the contact layer 5).

From this result, it can be seen that an electron density gradient is formed by forming a contact layer 5 and forming a pn junction in the graphene layer 1, and irradiating the graphene layer 1 having such an electron density gradient with electromagnetic waves increases the photocurrent.

Third Embodiment

Figure 11:
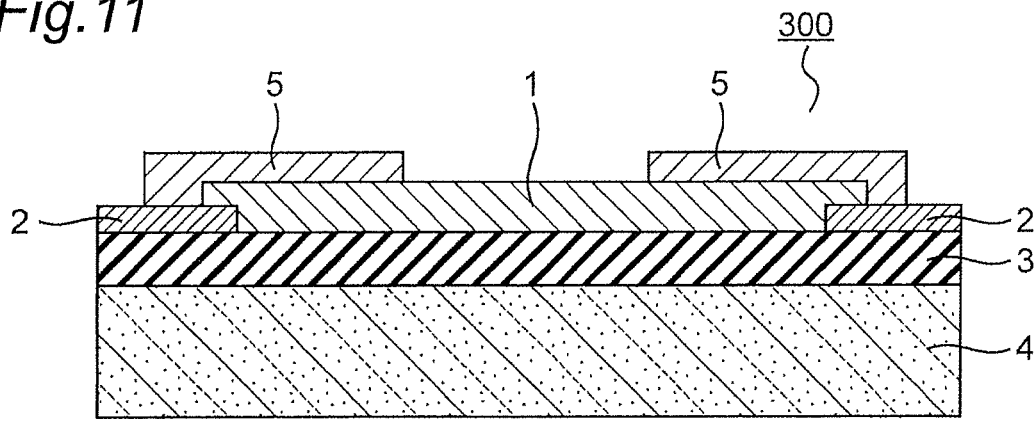
FIG. 11 is a cross-sectional view of an electromagnetic wave detector according to a third embodiment of the present invention.
Figure 12:
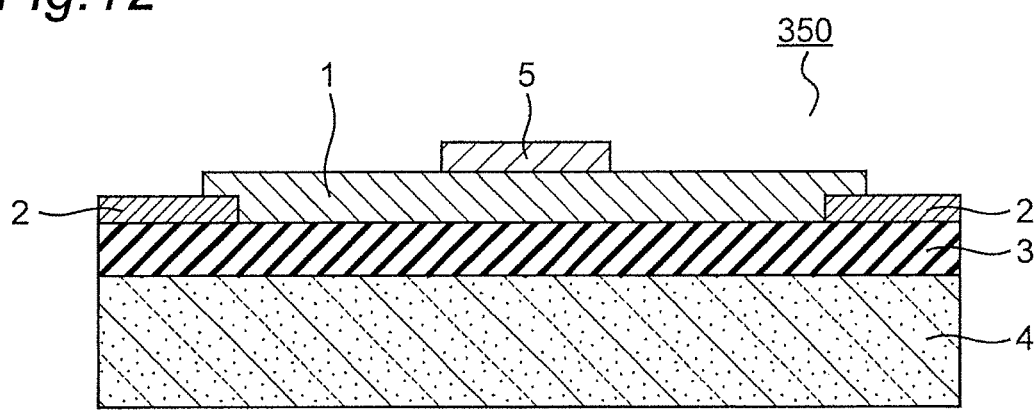
FIG. 12 is a cross-sectional view of another electromagnetic wave detector according to the third embodiment of the present invention.

FIGS. 11 and 12 are cross-sectional views of the electromagnetic wave detectors, the whole of which are denoted by 30C and 350, according to the third embodiment of the present invention when viewed in the same direction as the A-A direction in FIG. 1. In FIGS. 11 and 12, the same reference numerals as those in FIG. 2 denote the same or corresponding parts.

As shown in FIG. 11, in the electromagnetic wave detector 300 according to the fifth embodiment, both end portions are covered with the contact layer 5 except for the central portion of the graphene layer 1. Except for the position where the contact layer 5 is provided, the other structures are the same as those of the electromagnetic wave detector 100 according to the first embodiment. For example, in the graphene layer 1 formed by the CVD method, the graphene layer 1 is usually doped p-type. Therefore, the contact layer 5 comes into contact with a part of the p-type graphene layer 1 to change the graphene layer 1 to the n-type region, whereby the graphene layer 1 can have the npn structure or the pnp structure. In the electromagnetic wave detector 300, the graphene layer 1 at both end portions covered with the contact layer 5 becomes n-type, and the graphene layer 1 at the central portion not covered with the contact layer 5 remains p-type. That is, an npn junction is formed in the graphene layer 1.

In the electromagnetic wave detector 350 shown in FIG. 12, the central portion of the graphene layer 1 is covered with the contact layer 5. In the electromagnetic wave detector 350, the central portion of the graphene layer 1 covered with the contact layer 5 becomes n-type, and the graphene layer 1 at both end portions not covered with the contact layer 5 remains p-type. That is, a pnp junction is formed in the graphene layer 1.

In these electromagnetic wave detectors 300 and 350, when electromagnetic waves are radiated, the photocurrent increases due to the optical switching effect, and the detection sensitivity improves. In addition, since a dark current during non-irradiation with electromagnetic waves is reduced, noise can be reduced.

The graphene layer 1 can further reduce the dark current by using two or more layers of graphene having a band gap or a two-dimensional material. In addition, when a graphene layer 1 formed, for example, on SiC doped n-type is used, it is preferable to use a p-type contact layer 5 as a counter electrode to the n-type.

Figure 13:
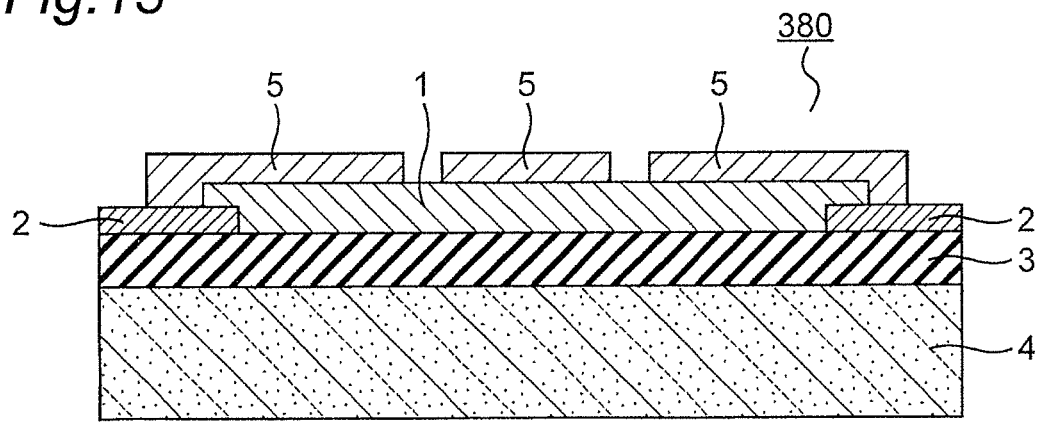
FIG. 13 is a cross-sectional view of another electromagnetic wave detector according to the third embodiment of the present invention.

FIG. 13 is a cross-sectional view of another electromagnetic wave detector, the whole of which is denoted by 380, according to the third embodiment of the present invention when viewed in the same direction as the A-A direction in FIG. 1. In FIG. 13, the same reference numerals as those in FIG. 2 denote the same or corresponding parts.

As can be seen from FIG. 13, in the electromagnetic wave detector 380, a plurality of contact regions and non-contact regions in the graphene layer 1, which are formed by the contact layer 5 formed on the graphene layer 1, exist alternately. Thus, since an electron density gradient is formed at the interface between the contact region under the contact layer 5 in the graphene layer 1 and the non-contact region not in contact with the contact layer 5, a plurality of electron density gradients are formed in the graphene layer 1. Thus, the photocurrent generated by the electromagnetic wave irradiation increases by the number of the interfaces between the contact regions and the non-contact regions, and the detection sensitivity increases. Thus, it is possible to increase the photocurrent by forming a large number of interfaces between the contact regions and the non-contact regions. In this case, the contact layers 5 to be formed may be periodically arranged or randomly arranged.

Fourth Embodiment

Figure 14:
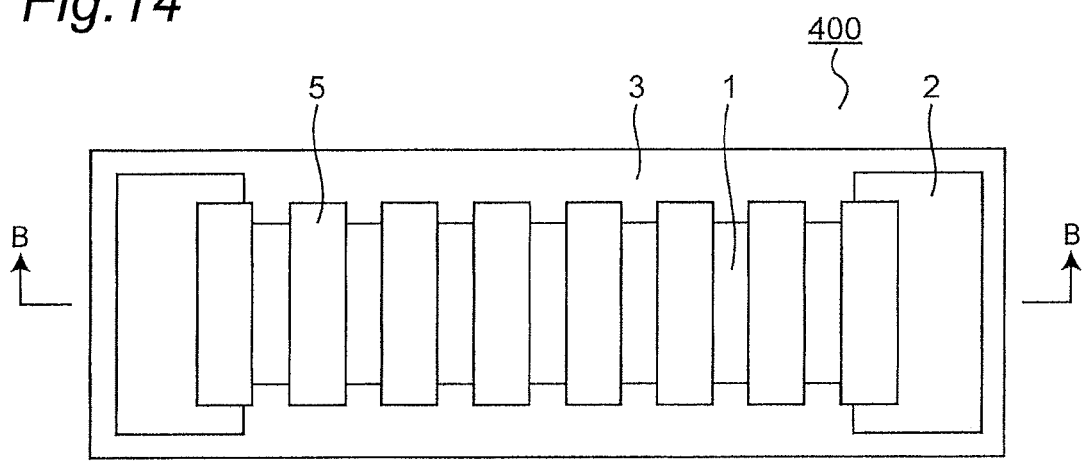
FIG. 14 is a top view of an electromagnetic wave detector according to a fourth embodiment of the present invention.
Figure 15:
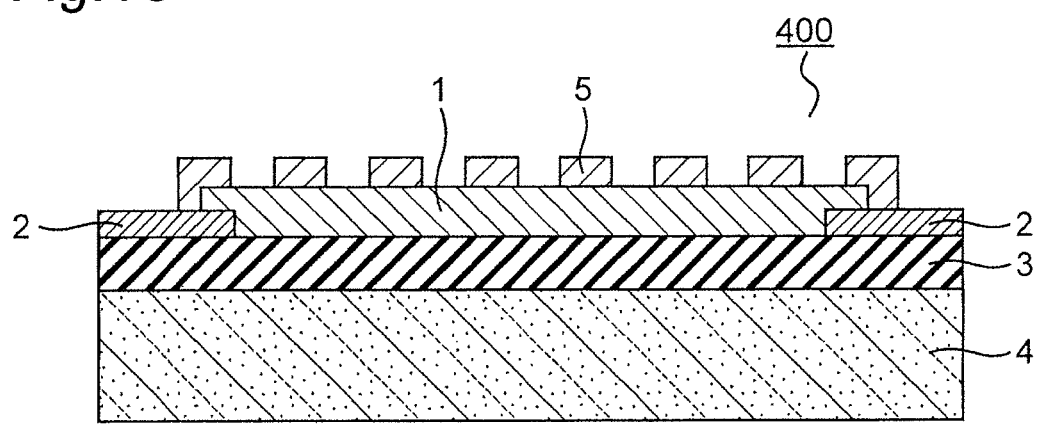
FIG. 15 is a cross-sectional view of the electromagnetic wave detector of FIG. 14 when viewed in a B-B direction.

FIG. 14 is a top view of an electromagnetic wave detector, the whole of which is represented by 400, according to a fourth embodiment of the present invention, and FIG. 15 is a cross-sectional view of the electromagnetic wave detector in FIG. 14 when viewed in the B-B direction. In FIGS. 14 and 15, the same reference numerals as those in FIGS. 1 and 2 denote the same or corresponding parts.

In the electromagnetic wave detector 400, on the graphene layer 1, a plurality of contact layers 5 are provided at a certain period from one electrode 2 to the other electrode 2. That is, as shown in FIG. 14, contact layers 5 are arranged at equal intervals between a pair of electrodes 2. When the contact layer 5 is a material that causes surface plasmon resonance to occur by electromagnetic wave irradiation, polarization dependency is generated by making the contact layer 5 a one-dimensional periodic structure. As a result, an electromagnetic wave detector that detects only specific polarized light can be formed. In FIG. 14, the contact layer 5 is arranged in the horizontal direction with respect to the electrode 2, but the contact layer 5 may be arranged in the vertical direction or may be angled.

Figure 16:
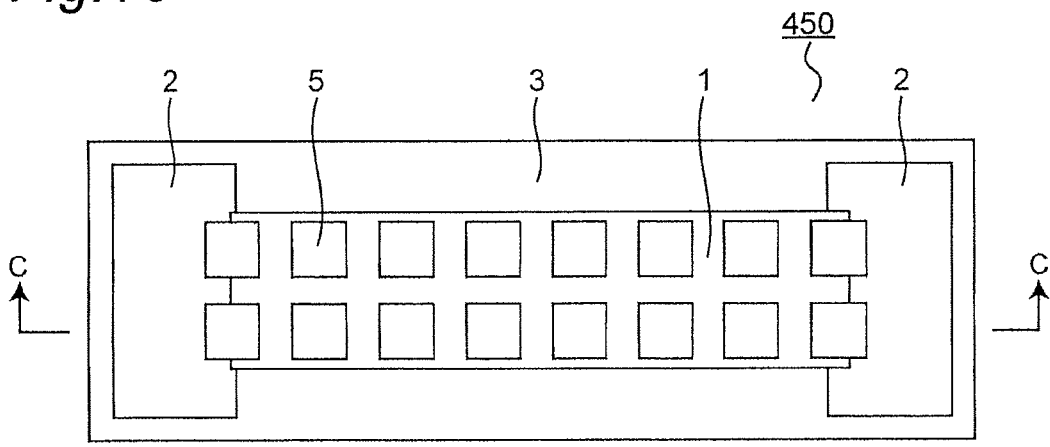
FIG. 16 is a top view of another electromagnetic wave detector according to the fourth embodiment of the present invention.
Figure 17:
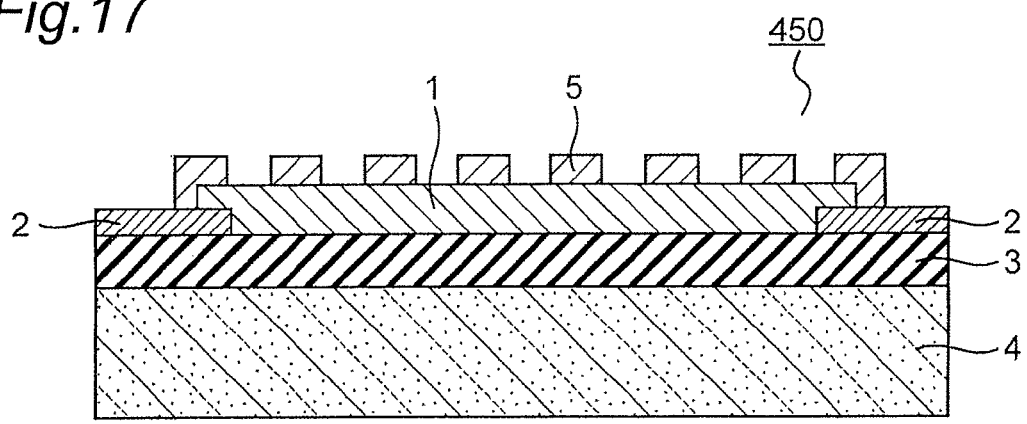
FIG. 17 is a cross-sectional view of the electromagnetic wave detector of FIG. 16 when viewed in a C-C direction.
Figure 26:
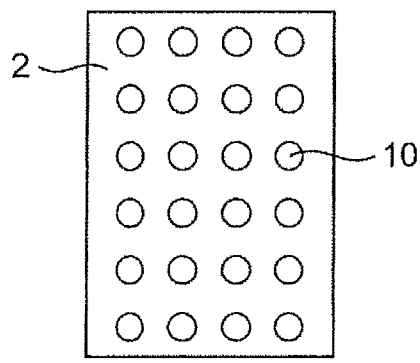
FIG. 26 is a top view of an electrode of the electromagnetic wave detector according to the ninth embodiment of the present invention.

FIG. 16 is a top view of another electromagnetic wave detector, the whole of which is represented by 450, according to the fourth embodiment of the present invention, and FIG. 17 is a cross-sectional view of the electromagnetic wave detector in FIG. 16 when viewed in the C-C direction. In FIGS. 26 and 17, the same reference numerals as those in FIGS. 1 and 2 denote the same or corresponding parts.

In the electromagnetic wave detector 450, as shown in FIG. 16, the contact layer 5 has a two-dimensional periodic structure. When the contact layer 5 is a material that causes surface plasmon resonance to occur by electromagnetic wave irradiation, using this periodic structure allows intensely detecting only an electromagnetic wave having a specific resonance wavelength and increasing the detection sensitivity of the specific wavelength. In addition, the period, shape, and size of the contact layer 5 may be optionally changed according to the resonance wavelength, or all of them may be randomly formed. When the period, shape, and size of the contact layer 5 are randomly formed, plasmon resonance can occur in multi-wavelengths, and the detection sensitivity can be increased in multi-wavelength electromagnetic waves.

Fifth Embodiment

Figure 18:
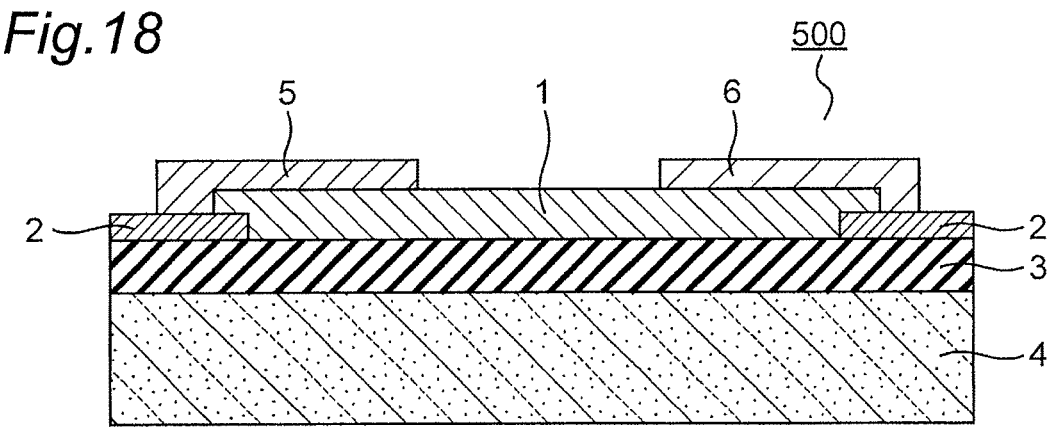
FIG. 18 is a cross-sectional view of an electromagnetic wave detector according to a fifth embodiment of the present invention.
Figure 19:
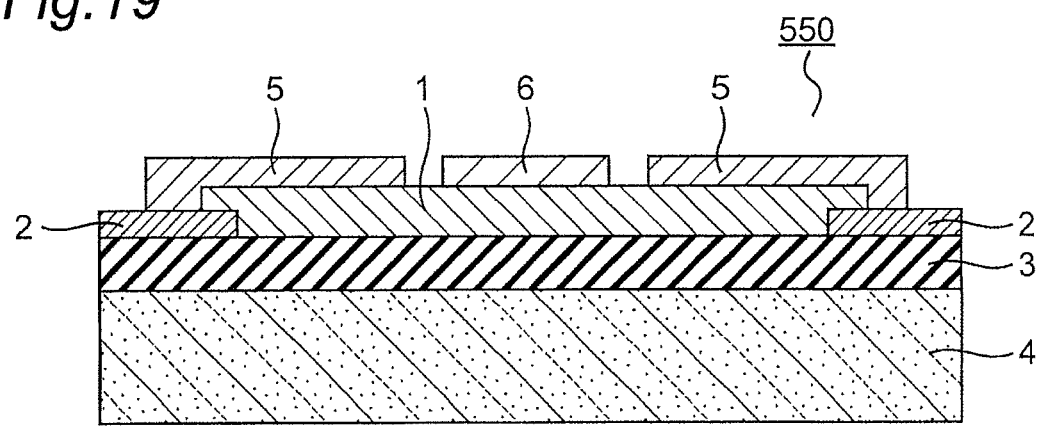
FIG. 19 is a cross-sectional view of another electromagnetic wave detector according to the fifth embodiment of the present invention.

FIG. 18 is a cross-sectional view of an electromagnetic wave detector, the whole of which is denoted by 500, according to a fifth embodiment of the present invention. In addition, FIG. 19 is a cross-sectional view of another electromagnetic wave detector, the whole of which is denoted by 550, according to the fifth embodiment of the present invention. Both of FIGS. 18 and 19 are cross-sectional views when viewed in the same direction as the A-A direction in FIG. 1, and in FIGS. 18 and 19, the same reference numerals as those in FIG. 2 denote the same or corresponding parts.

The electromagnetic wave detector 500 shown in FIG. 18 has the same structure as the electromagnetic wave detector 300 according to the third embodiment except that the contact layers 5 and 6 are formed of different materials. For example, setting the contact layer 5 to be p-type and the contact layer 6 to be n-type allows forming an electron density gradient also between the paired electrodes 2, improves the photocurrent extraction efficiency, and improves the detection sensitivity.

In addition, arranging the p-type contact layer 5 and the n-type contact layer 6 on the graphene layer 1 as the electromagnetic wave detector 550 shown in FIG. 19 allows forming a pnp structure regardless of the doping concentration or the conductivity type of the graphene layer 1.

Here, the contact layer 5 is set to be p-type and the contact layer 6 is set to be n-type, but the present invention is not limited thereto. Forming the contact layer 5 is effective if any electron density gradient is formed even a little in the graphene layer 1, and for example, the contact layers 5 and 6 may be a combination of n-type and p-type, n-type and $n^+$-type, p-type and $p^+$-type, and the like.

Sixth Embodiment

Figure 20:
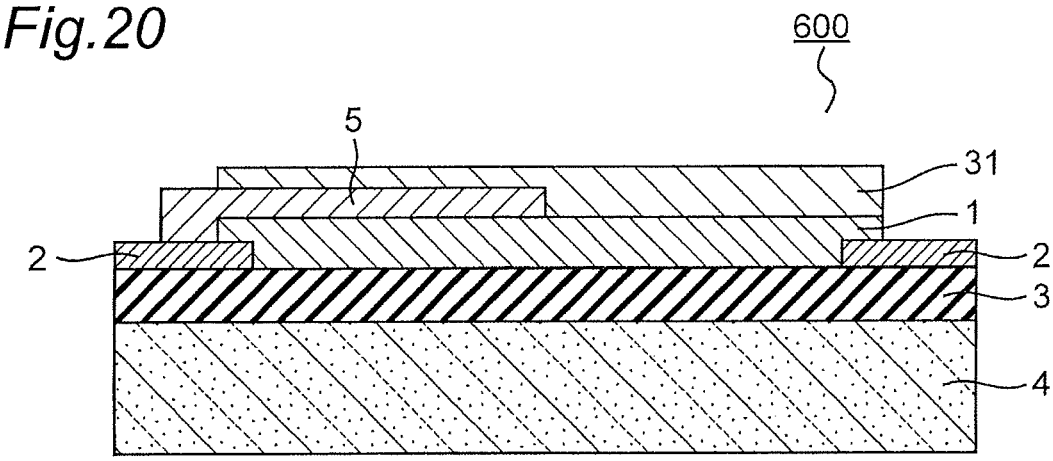
FIG. 20 is a cross-sectional view of an electromagnetic wave detector according to a sixth embodiment of the present invention.
Figure 21:
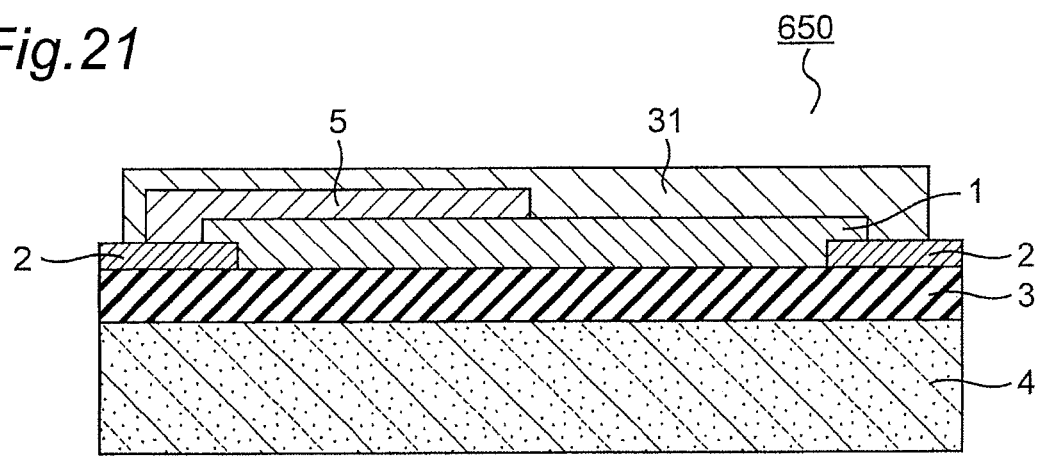
FIG. 21 is a cross-sectional view of another electromagnetic wave detector according to the sixth embodiment of the present invention.

FIG. 20 is a cross-sectional view of an electromagnetic wave detector, the whole of which is denoted by 600, according to a sixth embodiment of the present invention. In addition, FIG. 21 is a cross-sectional view of another electromagnetic wave detector, the whole of which is denoted by 650, according to the sixth embodiment of the present invention. Both of FIGS. 20 and 21 are cross-sectional views when viewed in the same direction as the A-A direction in FIG. 1, and in FIGS. 20 and 21, the same reference numerals as those in FIG. 2 denote the same or corresponding parts.

The electromagnetic wave detector 600 shown in FIG. 20 has a structure in which the graphene layer 31 is further provided on the contact layer 5, and the contact layer 5 is sandwiched between the upper and lower graphene layers 1 and 31. In this structure, a contact region and a non-contact region are respectively formed by the contact layer 5 in the upper graphene layer 31 and the lower graphene layer 1, and an electron density gradient is formed. As a result, photoelectric conversion is performed in both of the upper and lower graphene layers 1 and 31, and the photocurrent is increased due to the electron density gradient, so that the detection sensitivity is improved.

In the electromagnetic wave detector 600 shown in FIG. 20, the end portion of the contact layer 5 is not covered with the upper graphene layer 31. However, as in the electromagnetic wave detector 650 shown in FIG. 21, the contact layer 5 may be provided on the graphene layer 1, and further, another graphene layer 31 may be provided so as to cover the contact layer 5 and the graphene layer 1.

Seventh Embodiment

Figure 22:
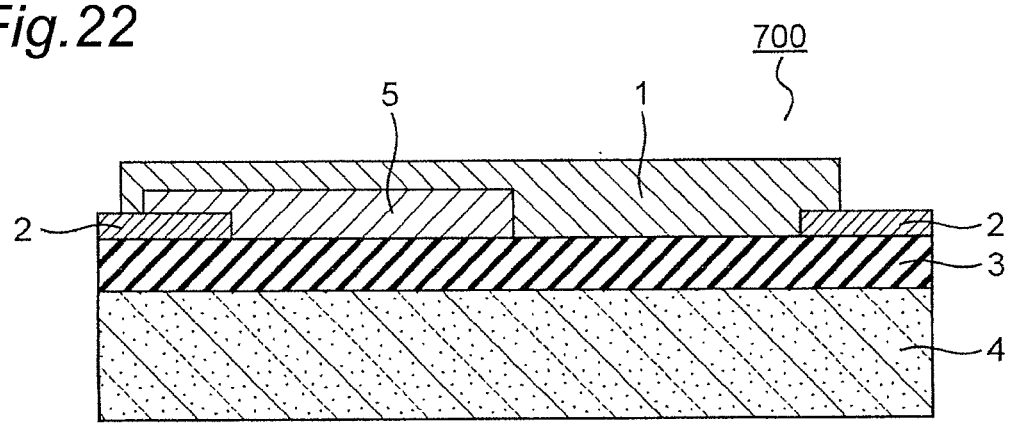
FIG. 22 is a cross-sectional view of an electromagnetic wave detector according to a seventh embodiment of the present invention.

FIG. 22 is a cross-sectional view of an electromagnetic wave detector, the whole of which is denoted by 700, according to a seventh embodiment of the present invention. FIG. 22 is a cross-sectional view when viewed in the same direction as the A-A direction in FIG. 1, and in FIG. 22, the same reference numerals as those in FIG. 2 denote the same or corresponding parts.

In the electromagnetic wave detector 700 shown in FIG. 22, the contact layer 5 is provided between the insulating layer 3 and the graphene layer 1. That is, the electromagnetic wave detector 700 has a structure in which the contact layer 5 is provided between the graphene layer 1 and the insulating layer 3. In this structure, since the input light reaches the graphene layer 1 without being blocked by the contact layer 5, a material that does not transmit electromagnetic waves can also be used as the material of the contact layer 5. For example, when visible light is used as input light, even if a material that does not transmit visible light is used as the contact layer 5, the input light can reach the graphene layer 1 without being attenuated.

In addition, transferring the graphene layer 1 after forming the contact layer 5 can prevent process damage to the graphene layer 1. In particular, since graphene is damaged by a wet process and mobility is easily lowered, transferring the graphene layer 1 after forming the contact layer 5 can effectively prevent process damage.

Eighth Embodiment

Figure 23:
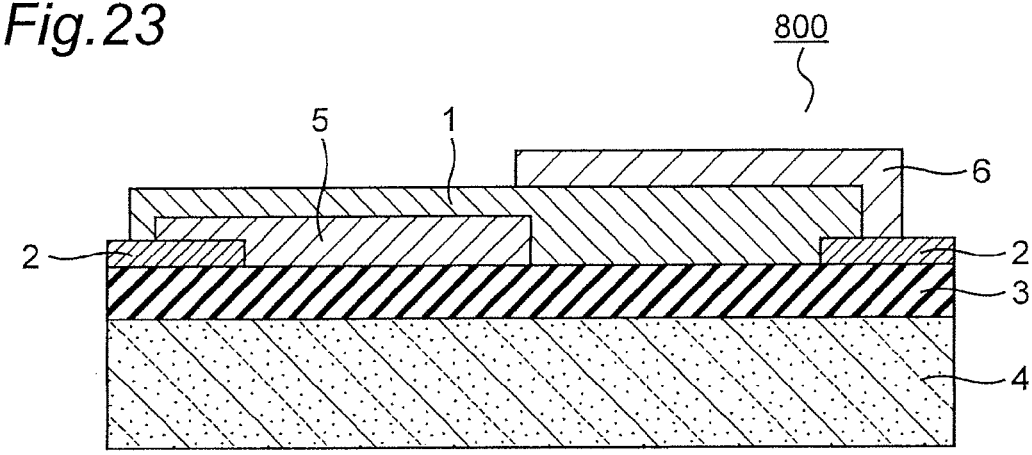
FIG. 23 is a cross-sectional view of an electromagnetic wave detector according to an eighth embodiment of the present invention.
Figure 24:
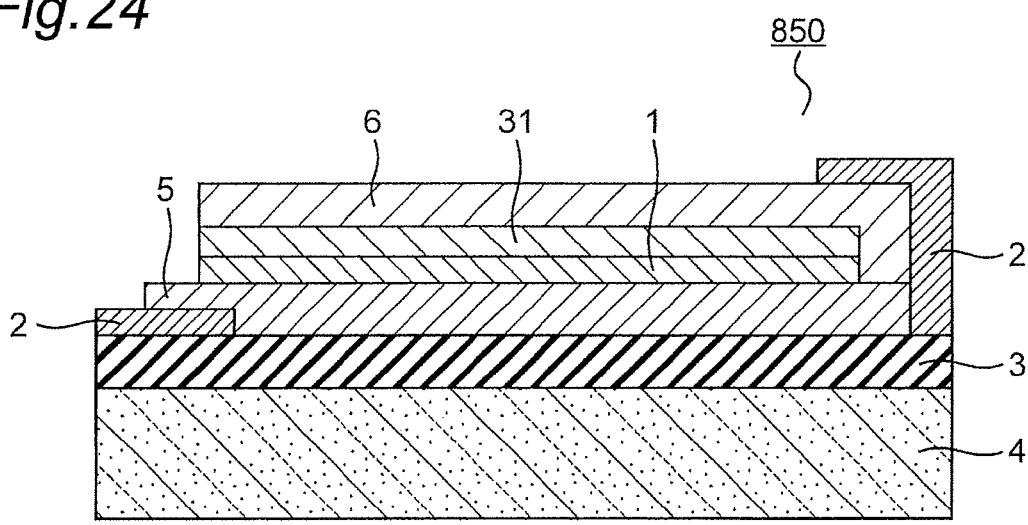
FIG. 24 is a cross-sectional view of another electromagnetic wave detector according to the eighth embodiment of the present invention.

FIG. 23 is a cross-sectional view of an electromagnetic wave detector, the whole of which is denoted by 800, according to an eighth embodiment of the present invention. In addition, FIG. 24 is a cross-sectional view of another electromagnetic wave detector, the whole of which is denoted by 850, according to the eighth embodiment of the present invention. FIGS. 23 and 24 are cross-sectional views when viewed in the same direction as the A-A direction in FIG. 1, and in FIGS. 23 and 24, the same reference numerals as those in FIG. 2 denote the same or corresponding parts.

In the electromagnetic wave detector 800 shown in FIG. 23, the contact layer 5 is directly provided on the insulating layer 3, the graphene layer 1 is formed on the contact layer 5, and the contact layer 6 is further provided thereon. That is, the contact layers 5 and 6 are made of materials different from each other, and the two contact layers 5 and 6 made of materials different from each other are arranged with the graphene layer 1 interposed therebetween. That is, the contact layers 5 and 6 are formed of two different materials, and the graphene layer 1 is sandwiched from the upper and lower sides by the contact layers 5 and 6. For example, using a p-type material for the contact layer 5 and an n-type material for the contact layer 6 allows forming an electron density gradient in the graphene layer 1, improves the photocurrent extraction efficiency, and improves the detection sensitivity.

In addition, forming regions in which the contact layer 5 and the contact layer 6 face each other across the graphene layer 1 (regions overlapped when viewed from the top surface) allows forming a pin junction. As a result, photoelectric conversion can be performed efficiently, the photocurrent is increased, and detection sensitivity is improved. For example, using a p-type material for the contact layer 5 and an n-type material for the contact layer 6 dopes the regions where the contact layer 5 and the contact layer 6 face each other across the graphene layer 1 with the p-type and n-type contact Layers from below and above, so that an electrically neutral i layer is formed.

In the electromagnetic wave detector 850 shown in FIG. 24, the contact layers 5 and 6 are formed of two different materials, and the contact layer 5, the graphene layers 1 and 31, and the contact layer 6 are stacked in this order on the insulating layer 3. A pair of electrodes 2 are provided on the insulating layer 3 and the contact layer 6. For example, by using a p-type material for the contact layer 5 and an n-type material for the contact layer 6, the graphene layer 1 is doped p-type and the graphene layer 31 is doped n-type. Forming one of the pair of electrodes 2 on the contact layer 6 allows applying an electric field in a direction perpendicular to the interface between the graphene layer 1 and the graphene layer 31. This allows a pn heterojunction to be formed in the vertical direction, so that OFF operation is enabled. This structure is more effective when applied with two-layer graphene having a band gap, a two-dimensional material, or the like. In FIG. 24, the graphene layer 1 and the electrode 2 are not in direct contact with each other, but a structure in which the graphene layer 1 and the electrode 2 are in direct contact may be used. In that case, the electric field applied to the graphene layer 1 is reduced, but the amount of current flowing increases.

Ninth Embodiment

Figure 25:
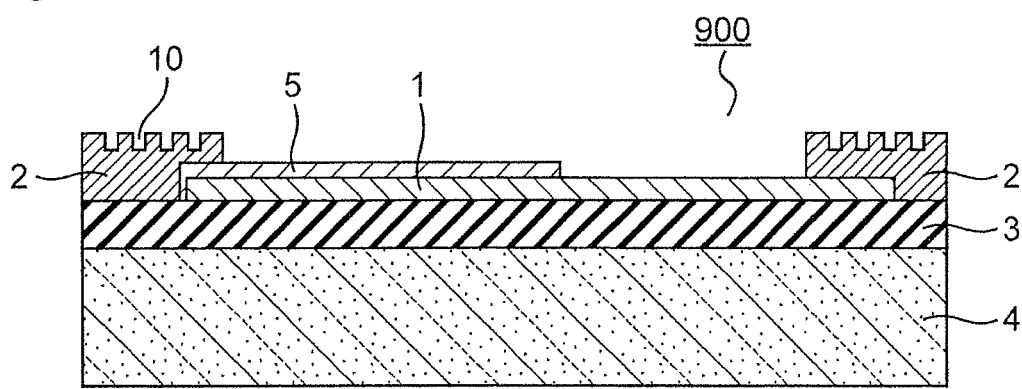
FIG. 25 is a cross-sectional view of an electromagnetic wave detector according to a ninth embodiment of the present invention.

FIG. 25 is a cross-sectional view of an electromagnetic wave detector, the whole of which is denoted by 900, according to the ninth embodiment of the present invention when viewed in the same direction as the A-A direction in FIG. 1. In FIG. 25, the same reference numerals as those in FIG. 2 denote the same or corresponding parts. In addition, FIG. 26 is a top view of the electrode 2 of the electromagnetic wave detector 900.

Figure 27:
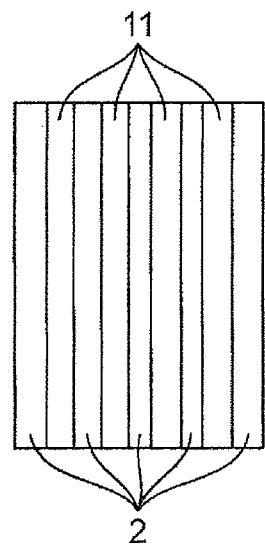
FIG. 27 is a top view of another electrode of the electromagnetic wave detector according to the ninth embodiment of the present invention.

In the electromagnetic wave detector 900, the electrode 2 has a periodic structure including periodic recesses 10, and an electromagnetic wave having a specific wavelength plasmon-resonates according to the periodic structure. The other structures are the same as those of the electromagnetic wave detector 100 according to the first embodiment. In FIG. 26, the cylindrical recesses 10 are arranged in two directions orthogonal to each other, and the arrangement of the recesses 10 may be any arrangement as long as it is a periodic arrangement, such as a square lattice and a triangular lattice. In addition, the shape of the recess 10 may be other shapes such as a prism, a triangular prism, a quadrangular prism, and an elliptic cylinder in addition to a cylinder. In addition, as shown in FIG. 27, the recess 11 may be a one-dimensional groove arranged in parallel. The cross-sectional shape of the groove is not limited to a rectangle, and may be a triangle or the like. In addition, plasmon resonance occurs in each of these recesses 10 and 11 whether or not they penetrate the electrode 2. The recesses 10 and 11 only need to be appropriately designed so as to cause the electromagnetic waves having the wavelengths to be detected to plasmon-resonate.

Providing these periodic recesses 10 and 11 on the surface of the electrode 2 causes plasmon resonance intensely localized on the metal surface at a specific wavelength to occur. The material of the electrode 2 may be any metal as long as the metal causes surface plasmon resonance to occur, and for example, Au, Ag, Al, or the like is used.

Here, the case where the periodic recesses 10 and 11 are formed on the surface of the electrode 2 is described, but periodic protrusions may be formed. Plasmon resonance with equivalent effect occurs.

Here, the resonance wavelength of the plasmon resonance is determined depending on the periodic structure of the recess 10 and the like. Forming this periodic structure on the electrode 2 allows absorbing only the electromagnetic wave having a specific resonance wavelength on the electrode surface. That is, in the electromagnetic wave detector 900, only an electromagnetic wave having a specific resonance wavelength can be intensely detected, and the detection sensitivity of the specific wavelength can be increased.

Tenth Embodiment

Figure 28:
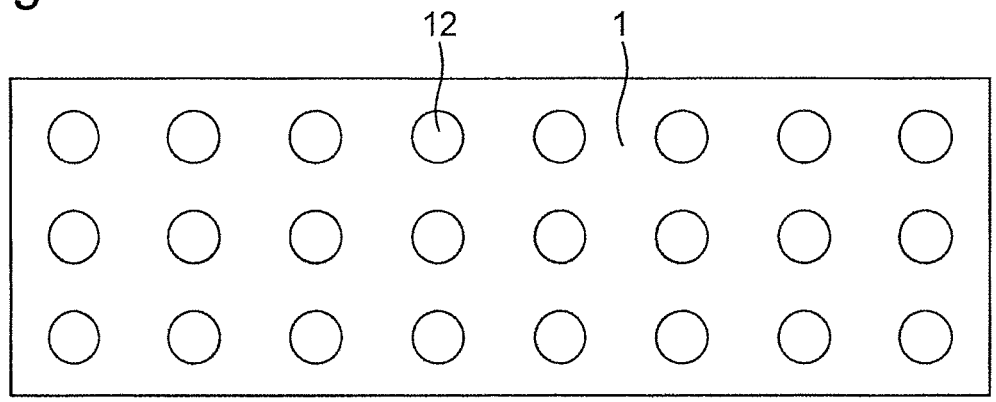
FIG. 28 is a top view of a graphene layer of an electromagnetic wave detector according to a tenth embodiment of the present invention.
Figure 29:
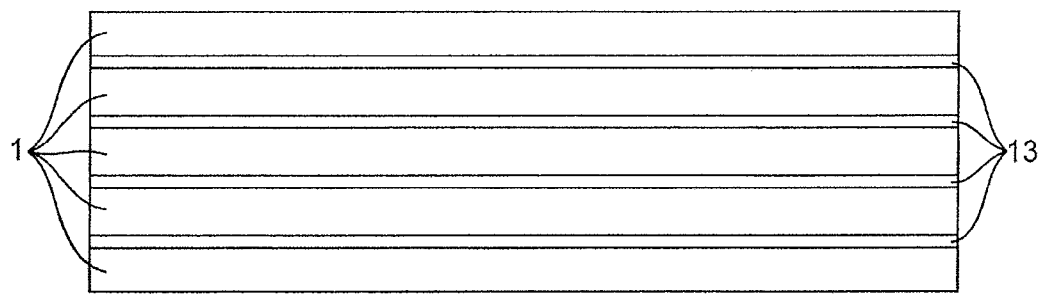
FIG. 29 is a top view of another graphene layer of the electromagnetic wave detector according to the tenth embodiment of the present invention.

FIGS. 28 and 29 are top views of a graphene layer 1 used in an electromagnetic wave detector according to a tenth embodiment of the present invention. In the electromagnetic wave detector according to the tenth embodiment, the graphene layer 1 has a periodic structure including periodic recesses 10, and an electromagnetic wave having a specific wavelength plasmon-resonates according to the periodic structure. The recesses 12 are cylindrical holes periodically arranged in two directions orthogonal to each other, and the recesses 13 are one-dimensional grooves arranged in parallel. The other structures are the same as those of the electromagnetic wave detector 100 according to the first embodiment.

The recesses 12 and 13 may be holes penetrating the graphene layer 1. That is, when the graphene layer 1 is a single layer, the recesses 12 and 13 are holes penetrating the graphene layer 1, and when the graphene layer 1 has a plurality of layers, the recesses 12 and 13 may be holes penetrating only a part of these layers or holes penetrating all the layers.

Thus, even when a periodic structure is formed in the graphene layer 1, an electromagnetic wave having a specific wavelength according to the periodic structure can be absorbed as in the case where the periodic structure is formed in the electrode 2. Since graphene is semimetal, its principle is based on plasmon resonance similar to the principle of metal.

The two-dimensional periodic arrangement of the recesses 12 may be any periodic arrangement such as a square lattice or a triangular lattice. In addition, the shape of the recess 12 may be a recess of any shape such as a cylinder, a prism, a triangular prism, a quadrangular prism, or an elliptic cylinder. However, when the shape viewed from the top surface has asymmetry, such as a triangular prism, since polarization dependency occurs in the light absorbed by the graphene layer 1, an electromagnetic wave detector that detects only specific polarized light can be formed. The one-dimensional periodic arrangement is, for example, a one-dimensional groove arranged in parallel as shown in FIG. 29. The cross-sectional shape of the groove is not limited to a rectangle, and may be a triangle or the like.

Here, in the case of a recessed shape having asymmetry such as the recess 12 having an ellipse or a rectangle or the recess 13 having a one-dimensional groove, polarization dependency occurs in light detection. Therefore, the electromagnetic wave detector having this asymmetric structure can also be applied to polarization imaging.

Polarization imaging enables discrimination of object boundaries, artifacts, natural objects, and the like. Conventionally, it has been necessary to attach another component such as a polarizer or a polarizing filter to electromagnetic wave detectors, and there have been defects such as an increase in size of the apparatus and complication of the system. However, in the electromagnetic wave detector according to the embodiment of the present invention, forming an asymmetric recess in the graphene layer 1 allows achieving an electromagnetic wave detector for detecting a specific polarized light, so that the effects of miniaturizing the system, reducing the number of components, eliminating light loss with the polarizer and the filter, and the like are obtained.

Forming this periodic structure on the graphene layer 1 allows absorbing only an electromagnetic wave having a specific resonance wavelength on the surface of the graphene layer 1. That is, in the electromagnetic wave detector, only an electromagnetic wave having a specific resonance wavelength can be intensely detected, and detection sensitivity of the specific wavelength can be increased.

Here, the case where the periodic recesses 12 and 13 are formed on the surface of the graphene layer 1 is described, but a pattern that forms periodic protrusions may be used.

Eleventh Embodiment

In the electromagnetic wave detectors according to the first to tenth embodiments, electromagnetic waves are incident on the graphene layer 1 and photocurrent generated thereby is detected, but in the electromagnetic wave detector according to this embodiment of the present invention, a layer of a two-dimensional material made of transition metal dichalcogenide, black phosphorus, or the like is used instead of the graphene layer 1.

That is, the electromagnetic wave detector according to the embodiment of the present invention is an electromagnetic wave detector configured to detect electromagnetic waves by photoelectric conversion, the electromagnetic wave detector including: a substrate 4; an insulating layer 3 provided on the substrate 4; a two-dimensional material layer 1 provided on the insulating layer 3, the two-dimensional material layer 1 made of a transition metal dichalcogenide or black phosphorus; a pair of electrodes 2 provided on the insulating layer 3, each of the pair of electrodes 2 being connected to the two-dimensional material layer 1; and a contact layer 5 provided so as to come into contact with the two-dimensional material layer 1. The contact layer 5 is made of a material having a polar group, and electric charge is formed in the two-dimensional material layer 1 due to contact between the contact layer 5 and the two-dimensional material layer 1. The electromagnetic wave detector according to the embodiment of the present invention has the same structure as the electromagnetic wave detector 100 except that the graphene layer is replaced with a two-dimensional material layer.

Transition metal dichalcogenide, black phosphorus, and the like have the same atomic layer structure as graphene, and therefore are referred to as two-dimensional material, and the two-dimensional material includes transition metal dichalcogenide such as $MoS_2$, $WS_2$, and $WSe_2$ and black phosphorus. The two-dimensional material layer may have a structure in which layers made of the same type of materials or different materials of these materials are stacked. Alternatively, a stacked structure of perovskite and graphene or a different type of two-dimensional material may be used.

The two-dimensional materials such as these transition metal dichalcogenide materials and black phosphorus have predetermined band gaps. Therefore, the off current is substantially zero, so that the noise of the electromagnetic wave detector is reduced, and the performance of the electromagnetic wave detector can be improved.

In addition, in a structure in which two-dimensional materials such as transition metal dichalcogenide and black phosphorus are stacked, the magnitude of the band gap can be adjusted according to the number of layers. Therefore, the wavelength of electromagnetic waves to be detected can be selected according to the number of layers. Thus, a wavelength-selective electromagnetic wave detector that detects only an electromagnetic wave having a specific wavelength can be obtained.

In the electromagnetic wave detector according to the embodiment of the present invention, the magnitude of the band gap can be controlled depending on the number of layers of the stacked two-dimensional material layers, and it is unnecessary to control the magnitude of the band gap depending on the composition of the semiconductor material like a detector using a conventional semiconductor. Thus, it is easy to control the magnitude of the band gap. In addition, since there is no need to use an optical filter being a typical wavelength selection method, the number of optical parts can be reduced, and further, the loss of incident light due to passing through the filter can also be reduced.

In addition, when a two-dimensional material such as a transition metal dichalcogenide or black phosphorus is used, forming a stacked structure including a plurality of layers allows obtaining polarization dependency. Therefore, an electromagnetic wave detector that selectively detects only specific polarized light can be achieved.

Furthermore, of these two-dimensional materials such as transition metal dichalcogenide and black phosphorus, combining two or more types of different materials or combining graphene with a two-dimensional material such as transition metal dichalcogenide or black phosphorus to form a heterojunction allows achieving the same effect as the quantum well structure and the tunnel current in the conventional semiconductor materials between dissimilar materials. Thus, noise can be reduced and recombination can be reduced, so that the sensitivity of the electromagnetic wave detector can be increased.

Twelfth Embodiment

Figure 30:
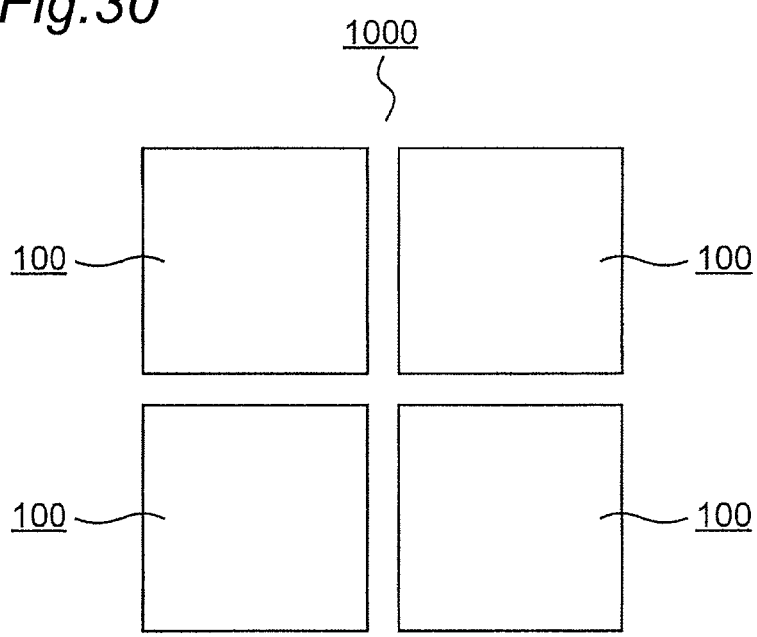
FIG. 30 is a top view of an array sensor according to a twelfth embodiment of the present invention.

FIG. 30 is a top view of an array sensor, the whole of which is denoted by 1000, according to a twelfth embodiment of the present invention, and this array sensor is an array sensor in which electromagnetic wave detectors are arranged in an array. In the array sensor 1000 shown in FIG. 30, the electromagnetic wave detector 100 according to the first embodiment of the present invention is arranged in 2×2, but the number of electromagnetic wave detectors to be arranged is not limited thereto.

In the array sensor 1000 including the electromagnetic wave detectors 100 using the graphene layer 1, electromagnetic waves in a very wide wavelength range from ultraviolet light to a microwave can be detected. Therefore, for example, when the array sensor 1000 is applied to an onboard sensor, the onboard sensor can be used as a visible light imaging camera during the day, and on the other hand, can also be used as an infrared camera during the night, so that there is no need to use different cameras depending on the wavelength to be detected.

In addition to the array sensor 1000, it is preferable to provide a circuit for reading electrical signals obtained from the respective electromagnetic wave detectors 100, a matrix selection circuit, and the like.

Figure 31:
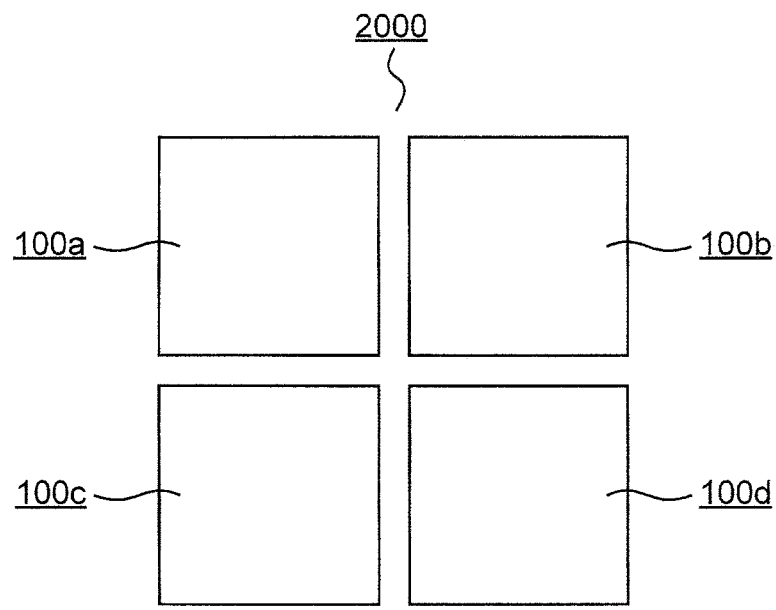
FIG. 31 is a top view of another array sensor according to the twelfth embodiment of the present invention.

FIG. 31 is a top view of another array sensor, the whole of which is denoted by 2000, according to the twelfth embodiment of the present invention. In FIG. 31, different types of electromagnetic wave detectors 100a, 100b, 100c, and 100d are arranged in 2×2, but the number of electromagnetic wave detectors to be arranged is not limited thereto.

In the array sensor 2000 according to the twelfth embodiment, various electromagnetic wave detectors described in the first to eleventh embodiments are arranged in a one-dimensional or two-dimensional array, which allows the array sensor 2000 to have a function as an image sensor.

For example, in the array sensor 2000 shown in FIG. 31, the electromagnetic wave detectors 100a, 100b, 100c, and 100d are formed of respective electromagnetic wave detectors having different detection wavelengths. Specifically, electromagnetic wave detectors having detection wavelength selectivity described in the ninth to eleventh embodiments are arranged in an array. Thus, the array sensor 2000 can detect electromagnetic waves having at least two or more different wavelengths.

Arranging the electromagnetic wave detectors 100a to 100d having different detection wavelengths in an array as described above allows obtaining colored images even in the wavelength range of ultraviolet light, infrared light, terahertz waves, and radio waves as with the image sensor used in the visible light range.

In addition, as an application other than the image sensor, even a small number of pixels can be used as a sensor for detecting the position of an object. The structure of the array sensor 2000 allows manufacturing of an image sensor that detects the light intensity of electromagnetic waves having a plurality of wavelengths. Thus, without color filters conventionally required for a complementary metal oxide semiconductor (CMOS) sensor or the like being used, electromagnetic waves having a plurality of wavelengths can be detected, and color images can be obtained.

Furthermore, arraying electromagnetic wave detectors having different polarized light to be detected also allows forming a polarized identification image sensor, and for example, allows distinguishing artifacts from natural objects.

Thirteenth Embodiment

Figure 32:
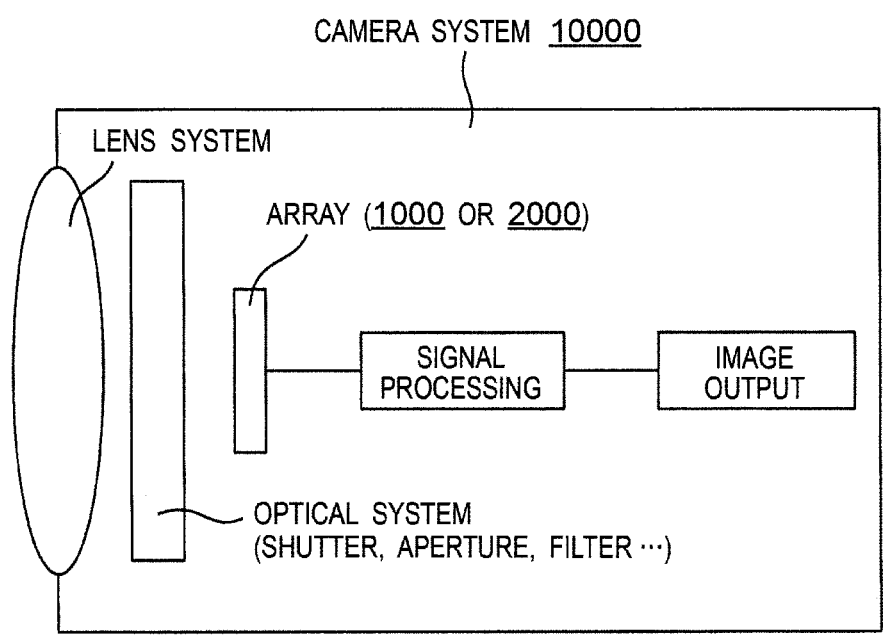
FIG. 32 is a diagram of a camera system according to a thirteenth embodiment of the present invention.

FIG. 32 is a diagram of a camera system, the whole of which is denoted by 10000, according to the twelfth embodiment of the present invention, and specifically, is a block diagram of a camera system mounting the array sensor 1000 or the array sensor 2000. The camera system 10000 according to the thirteenth embodiment of the present invention includes a lens, an optical system (a shutter, an aperture, a filter, and the like), an array sensor (1000 or 2000), a signal processing system, and an image output system. The incident electromagnetic wave is condensed by the lens and input to the array sensor. Furthermore, the output obtained from the array sensor is signal-processed and output as an image. As for the lens, a visible lens, a near infrared lens, an infrared lens, a terahertz lens, and the like are selected as necessary. Switching the lenses allows inputting light having various wavelengths into the array sensor without a filter. In this case, as the optical system, a shutter, an aperture, a filter, and the like may be selected as necessary, or may not be provided. In addition, when the lens is not used or when an ultra wideband lens is used, all the wavelengths can be detected by the array sensor.

In addition, a metamaterial lens may be used for the lens. In the metamaterial lens, the wavelength to be transmitted does not depend on the material, and by controlling the structure, it is possible to selectively control the wavelength to be transmitted. In addition, an ultra wideband lens capable of condensing light of all wavelengths to the same focal length can be achieved.

DESCRIPTION OF REFERENCE SYMBOLS

1 GRAPHENE LAYER
2 ELECTRODE
3 INSULATING LAYER

4 SUBSTRATE
5, 6 CONTACT LAYER
7 PROTECTIVE FILM
8, 9 ELECTRODE
10, 11, 12, 13 RECESS
100 ELECTROMAGNETIC WAVE DETECTOR
1000, 2000 ARRAY SENSOR
10000 CAMERA SYSTEM

The invention claimed is:

1. An electromagnetic wave detector configured to detect electromagnetic waves by photoelectric conversion, the electromagnetic wave detector comprising:
   a substrate;
   an insulating layer provided on the substrate;
   a graphene layer provided on the insulating layer as a photoelectric conversion layer;
   a pair of electrodes provided on the insulating layer, each electrode of the pair of electrodes directly contacting a bottom surface of the graphene layer; and
   a contact layer provided so as to contact with the graphene layer and to cover a part of the graphene layer,
   wherein the contact layer is partially provided between the pair of electrodes,
   wherein the contact layer is made of a material having a polar group, and an electric charge density gradient is formed in the graphene layer in a same plane due to contact between the contact layer and the graphene layer,
   wherein the graphene layer comprises:
      a contact region in which doping occurs due to contact between the contact layer and the graphene layer, and
      a non-contact region in which doping does not occur due to no contact between the contact layer and the graphene layer,
   wherein the contact layer comprises at least three contact layers which contact the graphene layer, at least two of the contact layers contacting a corresponding one of the pair of electrodes.

2. The electromagnetic wave detector according to claim 1, wherein the material of the contact layer chemically performs polarity conversion or performs polarity conversion by electromagnetic wave irradiation.

3. The electromagnetic wave detector according to claim 1, wherein the material of the contact layer is selected from a group consisting of: a polymer material having polarity, a material having a hydroxyl group or a carboxyl group, a material in which an oxidation-reduction reaction occurs by electromagnetic wave irradiation, a composition material comprising a photosensitizer having a quinone diazide group and a novolak resin, and an inorganic material having polarity.

4. The electromagnetic wave detector according to claim 1, wherein at least one of the at least three contact layers contacts with a part of the graphene layer of p-type to change the graphene layer to an n-type region and to cause the graphene layer to have an npn structure or a pnp structure.

5. The electromagnetic wave detector according to claim 1, wherein at least one of the at least three contact layers is made of the material and at least another one of the at least three contact layers is made of a second material different from the material.

6. The electromagnetic wave detector according to claim 5, wherein the at least one of the at least three contact layers and the at least another one of the at least three contact layers face each other across the graphene layer.

7. The electromagnetic wave detector according to claim 1, wherein the contact layer is provided on the graphene layer, and another graphene layer is further provided so as to cover the contact layer and the graphene layer.

8. The electromagnetic wave detector according to claim 1, wherein the contact layer is provided between the insulating layer and the graphene layer.

9. The electromagnetic wave detector according to claim 1, wherein the electrodes have a periodic structure including periodic recesses or protrusions, and an electromagnetic wave having a specific wavelength plasmon-resonates according to the periodic structure.

10. The electromagnetic wave detector according to claim 1, wherein the graphene layer has a periodic structure including periodic recesses or protrusions, and an electromagnetic wave having a specific wavelength plasmon-resonates according to the periodic structure.

11. An array sensor comprising two or more of the electromagnetic wave detector according to claim 1 arranged in an array.

12. The electromagnetic wave detector according to claim 1, wherein the at least three contact layers are formed of the same material.

13. The electromagnetic wave detector according to claim 1, wherein the at least three contact layers cover the part of the graphene layer, another part of the graphene layer, and both boundaries between the graphene layer and each electrode of the pair of electrodes respectively, and contact with both of the graphene layer and each electrode of the pair of electrodes respectively.

14. The electromagnetic wave detector according to claim 1, wherein a gate electrode is provided above the contact layer or on the graphene layer.

15. The electromagnetic wave detector according to claim 14, wherein the gate electrode is provided above the contact layer and the graphene layer is partially covered by the contact layer, and
   wherein a gate voltage is applied to at least a portion of the graphene layer through the contact layer.

16. The electromagnetic wave detector according to claim 13, wherein the at least three contact layers are provided at a certain interval between the pair of electrodes.

* * * * *